(12) United States Patent  Isaji et al.

(10) Patent No.: US 6,441,337 B1
(45) Date of Patent: Aug. 27, 2002

(54) LASER MACHINING METHOD, LASER MACHINING DEVICE AND CONTROL METHOD OF LASER MACHINING

(75) Inventors: Kazuhide Isaji, Osaka; Hidehiko Karasaki, Ashiya; Hisashi Kinoshita, Katano; Makoto Kato, Kawasaki, all of (JP)

(73) Assignee: Matsushita Electric Industrial Co., Ltd., Osaka (JP)

( * ) Notice: Subject to any disclaimer, the term of this patent is extended or adjusted under 35 U.S.C. 154(b) by 0 days.

(21) Appl. No.: 09/367,343
(22) PCT Filed: Dec. 10, 1998
(86) PCT No.: PCT/JP98/05583
 § 371 (c)(1),
 (2), (4) Date: Aug. 11, 1999
(87) PCT Pub. No.: WO99/30864
 PCT Pub. Date: May 24, 1999

(30) Foreign Application Priority Data

Dec. 12, 1997 (JP) .............................. 9-342453
May 8, 1998 (JP) ........................... 10-125682

(51) Int. Cl.⁷ ............................................. B23K 26/04
(52) U.S. Cl. ........................... 219/121.62; 219/121.83; 219/121.85
(58) Field of Search ....................... 219/121.62, 121.83, 219/121.85, 121.81, 121.78, 121.61, 121.6

(56) References Cited

U.S. PATENT DOCUMENTS 5,063,280 A  11/1991  Inagawa et al.

FOREIGN PATENT DOCUMENTS

| JP | 2-92482 | 4/1990 |
|---|---|---|
| JP | 3-124387 | 5/1991 |
| JP | 4-37494 | 2/1992 |
| JP | 4-45593 | 2/1992 |
| JP | 6-277863 | 10/1994 |
| JP | 50-22395 | 3/1995 |
| JP | 10-113781 | 5/1998 |

*Primary Examiner*—M. Alexandra Elve
(74) *Attorney, Agent, or Firm*—RatnerPrestia

(57) ABSTRACT

This is to present a laser machining method and a laser machining apparatus for drilling holes, capable of achieving conduction securely between adjacent conductive layers, by detecting the machining state of a workpiece adequately, and controlling the machining.

For this purpose, the number of laser pulse outputs capable of machining securely is preset. During laser machining, reflected laser beam intensity from the workpiece and incident laser beam intensity are detected, and the machining state of the workpiece is detected. As a result, when judging the workpiece has reached a desired machining state, laser machining is finished if the number of times of laser machining has not reached the set number of laser pulse outputs. If it is judged that the workpiece has not reached the desired machining state, laser machining is finished when reaching the set number of laser pulse outputs. As a result, the laser machining method and laser machining apparatus capable of drilling holes of high quality at high yield and shortening the machining cycle time can be realized.

16 Claims, 20 Drawing Sheets

FIG. 20

| Position | Reflection returning rate |
|---|---|
| (0, 0) | 0.40 |
| (1, 1) | 0.45 |
| · | · |
| · | · |
| · | · |
| (50, 50) | 1.00 |

LASER MACHINING METHOD, LASER MACHINING DEVICE AND CONTROL METHOD OF LASER MACHINING

This Application is a U.S. National Phase Application PCT International Application PCT/JP98/05583 filed on Dec. 10, 1998.

FIELD OF THE INVENTION

The present invention relates to a laser machining apparatus, and more particularly to a laser machining apparatus and its control method suitable for drilling holes in a circuit board formed by laminating an insulating layer and a conductive layer.

BACKGROUND OF THE INVENTION

Generally, circuit boards include the type called multilayer circuit board formed by laminating an insulating layer and a conductive layer alternately, and such multilayer circuit board is effective for enhancing the mounting density, and has come to be used widely.

Specifically, in the multilayer circuit board, holes are drilled in the insulating layer, and the holes are filled with solder or conductive paste to achieve conduction between adjacent conductive layers.

As the processing technology for drilling holes in such insulating layer, laser machining is widely employed.

The wavelength of the laser beam to be used is selected at a wavelength easy to be absorbed in the insulating layer and easy to be reflected in the conductive layer. For example, if the insulating layer is a glass epoxy resin and the conductive layer is a copper foil, carbon dioxide laser beam is used, so that the insulating layer only can be removed selectively.

It is important to drill holes so as to achieve conduction securely between adjacent conductive layers.

A prior art is disclosed, for example, in Japanese Laid-open patent No. 2-92482. According to this publication, when drilling holes in the workpiece by irradiating laser beam, the direct outputted beam from the laser output unit and the reflected beam from the workpiece are detected by individual sensors, and the reflected beam quantity ratio is calculated from the both beam quantities, then the laser beam is controlled by comparison with the reference value.

More specifically, when the reflected beam quantity ratio becomes larger than a predetermined reference value, the output unit is stopped.

By such operation, damage of conductive layer by laser beam is prevented, and the processing time is shortened at the same time.

The prior art, however, had the following problems.

That is, in the conventional machining method, only the reflected beam from the workpiece was detected. If the surface of the conductive layer for reflecting the laser beam of the workpiece is contaminated to absorb the laser beam due to some cause, the level of the reflected beam may not reach the specified level. As a result, excessive machining or abnormal heating may occur. When machining the workpiece, therefore, holes may not be drilled to a desired shape. This is one of the problems of the prior art.

Moreover, when the laser beam passes a focusing lens for machining, in the case of machining the center portion of the processing area by the scanning mirror, the laser beam is irradiated vertically to the object of machining. In the case of machining of peripheral portion, however, the laser beam is not irradiated vertically to the object of machining, and the laser beam reflected from the workpiece may be dislocated from the intermediate optical system parts, or may be irradiated to the optical parts holding portion, and the laser beam reflected from the workpiece may be diffused on the way, and part of the reflected beam may not reach the reflected beam detector. As a result, detection of reflected beam is imperfect, thereby lowering the precision of judgement of machining state of drilled holes.

Or, if the table on which the workpiece is mounted is inclined, similarly, part of the laser beam reflected from the workpiece may not return to the detector of laser beam. As a result, the reflected beam is not detected accurately, and the precision of judgement of machining sate of drilled holes is lowered. The prior art involved also such problems.

SUMMARY OF THE INVENTION

In the light of the above background, it is a first object of the invention to set the condition of every one pulse output of laser capable of machining the workpiece securely beforehand, and to set the maximum number of laser pulse capable of machining the workpiece securely beforehand. This is intended to control so as to stop the laser output unit when reaching a specified level by comparison with the reference value before reaching the preset number of outputs. As a result, laser machining is advanced in speed. In addition, setting of the maximum number of outputs can prevent excessive machining. Therefore, the machining yield is high and drilling of high quality is realized.

To achieve the object:

A first step is for setting the number of laser outputs as the laser output condition for drilling the workpiece by plural times of laser pulse outputs. Thereafter, laser machining is executed.

A second step is for detecting the machined state of the workpiece during execution of laser machining, and judging if reaching a desired machining state or not by laser machining.

A third step is for finishing the laser machining when judging that the workpiece has reached the desired machining state if not reaching the set number of laser outputs. Otherwise laser machining is continued to the set number of laser pulse.

Thus, the laser machining is carried out in three steps.

It is a second object to detect the laser light reflected from the workpiece by the detector, and correct the intensity signal of the detected laser light. That is, the laser light reflected from the workpiece is detected by the detector, the intensity signal of the detected laser light is corrected, and the intensity of the laser light reflected from the workpiece is calculated accurately. Thus, the machining state of drilling is detected accurately, and drilling of high quality is realized.

To achieve the object, the invention provides a control method of laser machining apparatus comprising the steps of:

detecting the reflected light intensity of the workpiece by a reflected light detector, calculating the reflected light intensity right after reflection from the workpiece on the basis of the data of the reflected light distribution table storing the rate of change of the reflected light from the workpiece reaching the reflected light detector in every machining position of the workpiece, and controlling the laser output unit on the basis of the comparison between the calculated reflected light intensity and the reference value.

BRIEF DESCRIPTION OF THE DRAWINGS

FIG. 20 is a diagram showing a specific example of reflected beam distribution table.

DESCRIPTION OF THE PREFERRED EMBODIMENTS

Embodiment 1

Figure 1:
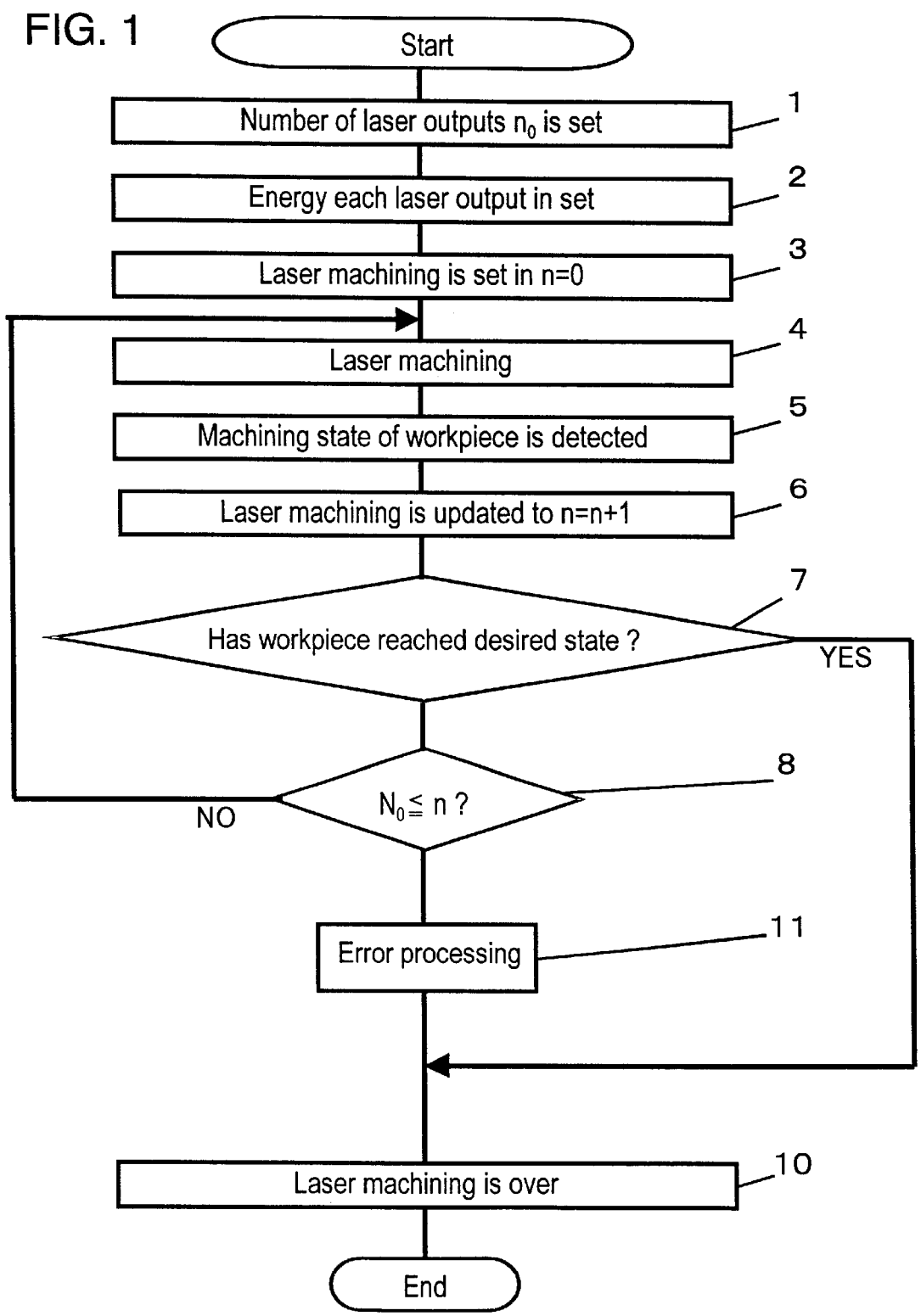
FIG. 1 is a diagram showing a machining flow of a laser machining method showing embodiment 1.

Referring now to the drawings, embodiment 1 of the invention is described in detail below. FIG. 1 is a diagram showing machining flow of laser machining method of the embodiment.

Step 1: The number of the output pulses of the laser is set up.

Step 2: The laser energy condition necessary for machining of the workpiece is set up. The laser energy condition is such as 1 pulse laser output, pulse width, and pulse interval.

The number of laser output pulses at step 1, and the laser energy condition setting at step 2 are preliminary setting of condition for machining the workpiece securely. For example, the energy per 1 laser pulse is set at 10 mJ, and the number of output pulses is 3. Or the energy may be changed in every one laser pulse, such as 2 output pulses of 10 mJ, or 2 output pulses of 5 mJ.

Step 3: Before execution of laser machining, the number of a counter is set up in 0. The counter has the function which counts the number of the pulses of laser machining.

Step 4: One laser pulse beam irradiates the workpiece on the laser energy condition set at step 2, and laser machining is executed.

Step 5: The machining state of the workpiece by laser machining of step 4 is detected.

Step 6: The number of pulses of laser pulse beam irradiated to the workpiece is counted.

Step 7: The detection result of the machining state of the workpiece at step 5 is judged, whether the workpiece has reached a predetermined desired machining state or not. When reaching the desired machining state as a result of judgement, laser machining is finished.

Step 8: If not reaching the desired machining state as a result of judgement at step 7, the number of output pulses set at step 1 and the number of laser beam machining pulses counted at step 6 are compared. As a result of comparison, if not reaching the number of output pulses set at step 1, back to step 4, the laser pulse machining, detection of machining state, counting of number of machining laser pulses, and judgement of machining state are repeated in the determined condition.

Step 10: When reaching the desired machining state as judged at step 7, laser machining is finished.

Thus, according to the embodiment, by finishing the process when the workpiece has reached the desired machining state before the number of times of laser machining reaches the set number of laser outputs, holes of high quality are drilled at high yield, and the machining cycle time is shortened.

Herein, the desired machining state is set somewhere between the state of less than the allowable upper limit of machining and the state more than the allowable lower limit of machining.

Step 11: When the result judged at step 7 has not reached the desired machining state and the number of machining laser pulses counted at step 6 has reached the number of output pulses set at step 1, the hole is processed as a machining error.

The error processing step 11 is intended to discard the workpiece not reaching the desired machining state, and next pulse machining start. Or, by storing the coordinates of the pulse drilled hole not reaching the desired pulse machining state, the position may be machined later, or discarded in a later process.

Herein, the effect of setting the number of outputs at step 1 is described.

Hitherto, only the reflected beam from the workpiece was detected. In such a case, if the surface of the conductive layer of the workpiece for reflecting the laser beam is contaminated to absorb laser beam by some cause, the level of the reflected beam may not reach the specified level. Accordingly, excessive machining or abnormal heating may occur. In this invention, on the other hand, since the maximum output number for irradiating laser beam is preset, excessive machining is avoided.

The detecting method of machining state of workpiece, and laser machining method are described below.

Figure 2:
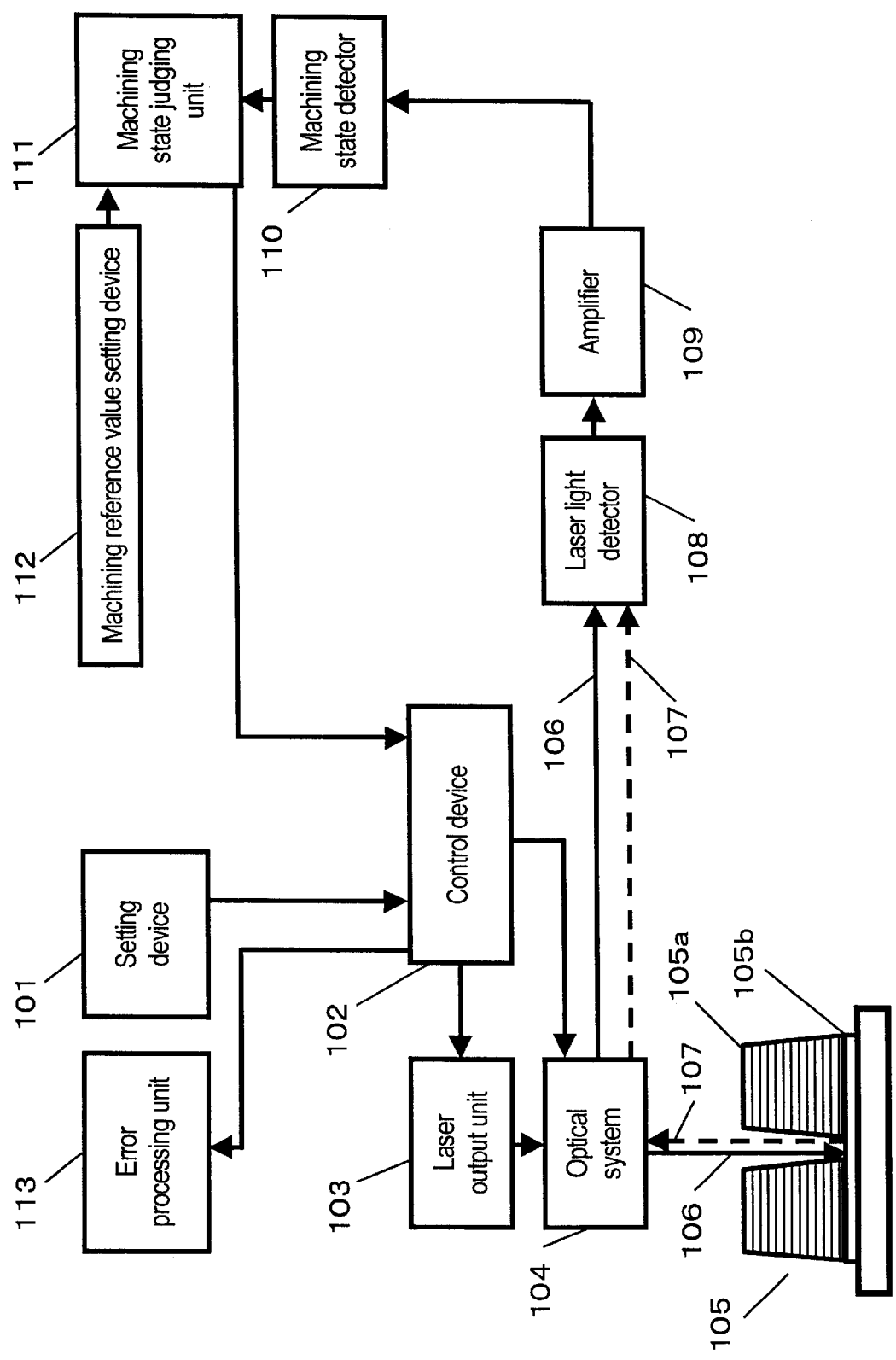
FIG. 2 is an outline drawing explaining a method of detecting the machining state and laser machining method in embodiment 1.

FIG. 2 is an outline drawing showing the method of detecting the machining state of workpiece and the laser machining method.

In FIG. 2, reference numeral 101 is a setting unit of laser energy condition and number of laser output pulses, reference numeral 102 is a controller, reference numeral 103 is a laser output unit, reference numeral 105 is a workpiece such as circuit board, reference numeral 105a is an insulating layer of the workpiece, reference numeral 105b is a conductive layer of the workpiece, reference numeral 106 is laser beam outputted from the laser output unit 103, reference numeral 104 is an optical system, reference numeral 107 is reflected laser beam from the workpiece, reference numeral 108 is a laser beam detector, reference numeral 109 is an amplifier, reference numeral 110 is a machining state detector, reference numeral 111 is a machining state judging unit, reference numeral 112 is a machining reference value setting unit, and reference numeral 113 is an error processing unit.

In this constitution, the operation of this detecting method is described in detail below.

First, the setting unit 101 sets the laser energy condition necessary for machining of workpiece such as the laser output per 1 pulse, pulse width, and pulse interval, and the number of laser output pulses. The laser energy condition and the number of laser output pulses set herein are the conditions for machining the workpiece securely.

This pulse machining condition is sent to the controller 102. The controller 102 indicates that the pulse machining condition is outputted in the output unit 103. The laser output unit 103 according to the pulse machining condition of the setting unit 101 outputs the laser beam 106. The laser beam 106 is guided into the workpiece 105 such as circuit board through the optical system 104, and part of the laser beam 106 is led into the laser beam detector 108, and the laser beam guided into the workpiece machines the insulating layer 105a of the workpiece 105 such as circuit board by pulses. While the conductive layer 105b of the workpiece 105 is not exposed, the laser beam 106 is absorbed in the insulating layer. As pulse machining advances, the conductive layer 105b beneath the insulating layer is exposed, and at the same time part of the laser beam irradiated to the workpiece 105, that is, the laser beam reaching the conductive layer 105b is reflected to be reflected laser beam 107, which runs reversely in laser beam path. In an intermediate optical system 104, the reflected laser beam 107 is separated and is guided into the laser beam detector 108. In the laser beam detector 108, the laser beam, that is, part of the incident laser beam 106 and part of the reflected laser beam 107 are detected, and an incident beam intensity signal and a reflected beam intensity signal are sent into the amplifier 109. The amplifier 109 amplifies each signal, and transmits each signal to the machining state detector 110. In the machining state detector 110, the reflected beam intensity signal is corrected as required, and is divided by the incident beam intensity signal, and a normalizing signal is generated.

In the machining state judging unit 111, the reference value preset in the machining reference value setting unit 112 and the normalizing signal sent from the machining state detector 110 are compared, and the pulse machining state is judged.

As for the machining reference value, from the relation between the normalizing value and the hole drilled in the workpiece, that is, the exposed area of the conductive layer, the normalizing value is larger when the area of the conductive layer is wider. Accordingly, the normalizing value corresponding to the desired hole is set, and when exceeding this reference value, it is judged that the desired hole is exceeded, and if lower than this reference value, it is judged not reaching the desired hole. Such judgement is transmitted to the controller 102.

When reaching the desired hole, the controller 102 indicates that finishes pulse machining, even if the number of times of laser machining has not reached the value set in the setting unit 101.

Thus, according to this embodiment, by finishing the process when the workpiece has reached the desired machining state before the number of times of laser machining reaches the set number of laser outputs, holes of high quality are drilled at high yield, and the machining cycle time is shortened.

If not reaching the desired hole, to the contrary, laser machining is continued. The laser machining and machining state judgement are repeated up to the number of output pulses set in the setting unit 101.

When the number of machining laser pulses has reached the number of output pulses set in the setting unit 101, the machining state is judged on the spot.

In the judgement of the machining state by the machining state judging unit 111, if not reaching the desired machining state, the hole is processed as a machining error.

The error processing unit 113 discards the workpiece not reaching the desired machining state, and starts next process. Or, by storing the coordinates of the pulse drilled hole not reaching the desired pulse machining state, the position may be machined later, or discarded in a later process.

In this machining, the laser beam 106 outputted from the laser output unit 103 is detected by the laser beam detector 108, and the laser beam 106 is reflected by the workpiece 105, and this reflected laser beam 107 is detected by the laser beam detector 108, and an incident beam intensity signal and a reflected beam intensity signal are sent into the amplifier 109. The amplifier 109 amplifies each signal, and transmits each signal to the machining state detector 110. In the machining state detector 110, the reflected beam intensity signal is corrected as required, and is divided by the incident beam intensity signal, and a normalizing signal is generated. However, if the laser energy conditions necessary for machining of workpiece such as the laser output per 1 pulse, pulse width, and pulse interval to be set in the setting unit 101 are identical in each output pulse, it is not necessary to detect the incident laser beam 106 by the laser beam detector 108. In this case, only the reflected laser beam 107 is detected by the laser beam detector 108, and the reference value in this case is preset in the machining reference value setting unit 112, and the contrast with the data is judged in the machining state judging unit 111, and the result is transmitted to the controller 102.

By operating in such process, the insulating layer of the workpiece can be machined precisely as desired.

Figure 3A:
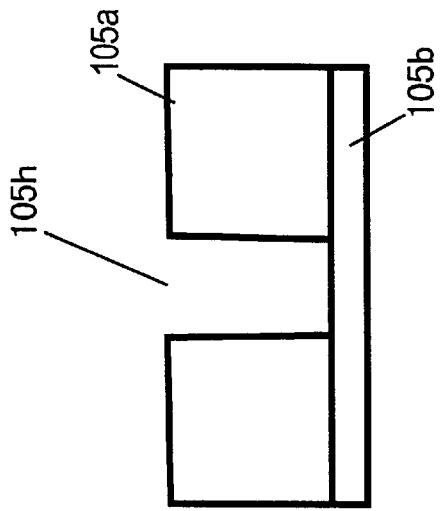
FIG. 3A is a diagram schematically showing a mode in which a drilled hole in the workpiece has not reached the conductive layer.
Figure 3B:
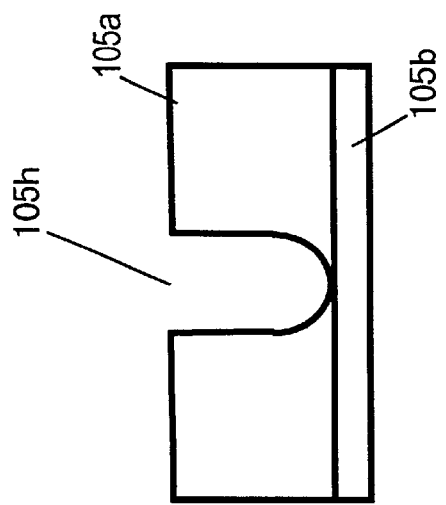
FIG. 3B is a diagram schematically showing,a mode in which part of the drilled hole in the workpiece has reached the conductive layer.
Figure 3C:
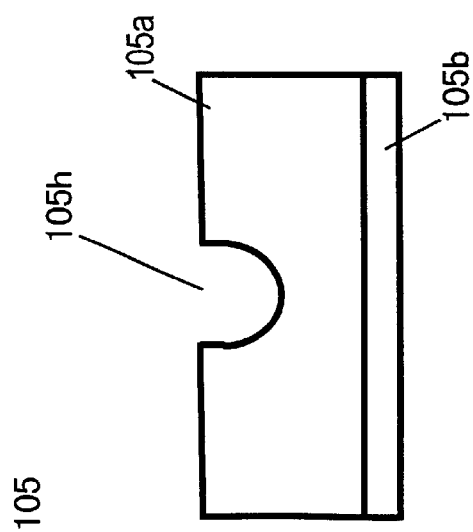
FIG. 3C is a diagram schematically showing a mode in which a majority of the drilled hole in the workpieces has reached the conductive layer.

For the understanding of the above explanation, the machining state of the workpiece is described in FIG. 3A, FIG. 3B, and FIG. 3C.

FIG. 3A, FIG. 3B, and FIG. 3C show the steps of the drilled hole 105*h* becoming deeper gradually. As schematically illustrated, in FIG. 3A, the drilled hole 105*h* has not reached the conductive layer 105*b* yet, in FIG. 3B, part of the drilled hole 105*h* has reached the conductive layer 105*b*, and in FIG. 3C, the majority of the drilled hole 105*h* has reached the conductive layer 105*b*.

Since reflection of output laser beam 106 mostly occurs in the conductive layer 105*b*, the quantity of beam of the reflected laser beam 107 becomes larger in the sequence of FIG. 3A, FIG. 3B and FIG. 3C.

The signal about the beam intensity of the reflected laser beam 107 detected by a reflected beam detector (not shown) constituted in the laser beam detector 108 is sent out to the machining state detector 110 through the amplifier 109, and is compared with the reference value preset in the machining state detector 110, and it is judged if machining is complete or not, and this judgement information is sent out into the controller 102 through the machining state judging unit 111.

When the reference value is set in the middle between the reflected beam quantity from the hole state in FIG. 3B and the reflected beam quantity from the hole state in FIG. 3C, since the reflected beam quantity from the hole in FIG. 3B is smaller than the reference value, the machining state judging unit 111 judges that machining is not complete yet, and sends a command signal for further irradiating laser beam 106 to the controller 102.

On the other hand, since the reflected beam quantity from the hole in FIG. 3C is greater than the reference value, the machining state judging unit 111 judges that machining is complete, and sends a command signal for not irradiating further laser to the corresponding hole position to the controller 102.

The laser machining method in embodiment 1 is described herein. And further the laser output unit 103, optical system 104, and laser beam detector 108 are specifically described below.

Figure 4A:
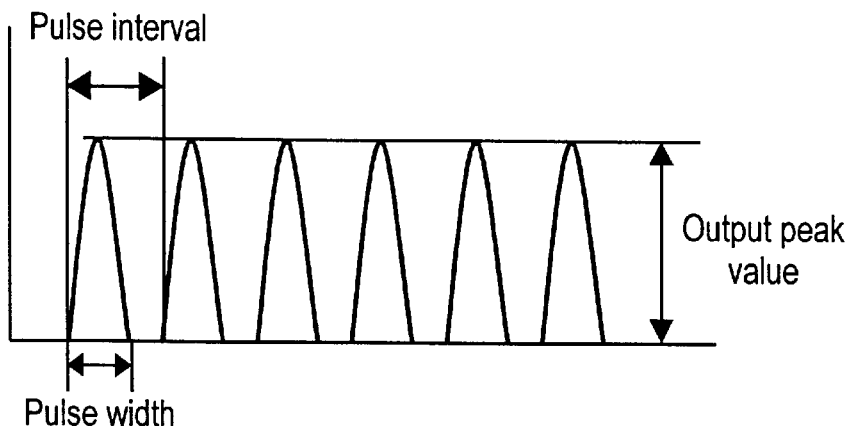
FIG. 4A is a diagram schematically showing a standard laser pulse output waveform.
Figure 4B:
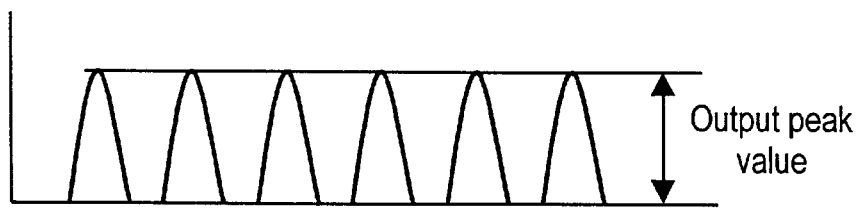
FIG. 4B is a diagram showing an example of change of peak value of laser pulse output as compared with FIG. 4A.
Figure 4C:
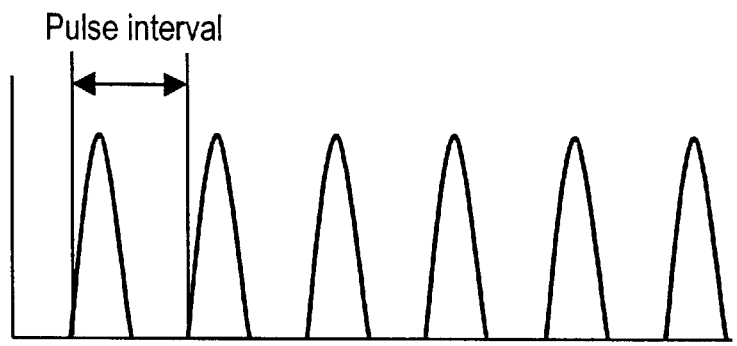
FIG. 4C is a diagram showing an example of change of pulse interval of laser pulse as compared with FIG. 4A.
Figure 4D:
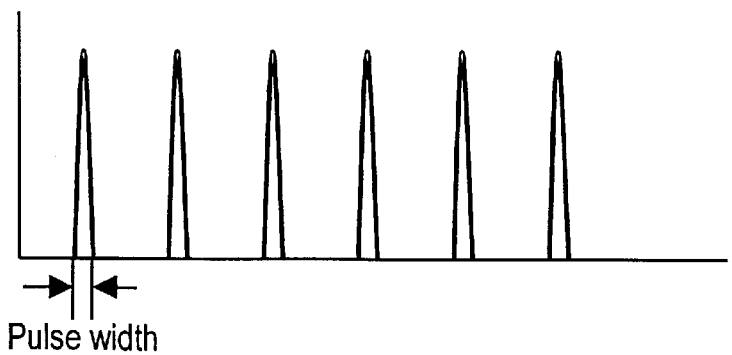
FIG. 4D is a diagram showing an example change of pulse width of laser pulse as compared with FIG. 4A.

FIG. 4A, FIG. 4B, FIG. 4C, and FIG. 4D schematically show an example of laser pulse beam output from the laser oscillator for composing the laser output unit 103 of the embodiment. FIG. 4A shows the output peak value and pulse width of one laser beam pulse, and also shows the pulse interval in the case of repeated outputs of pulses. FIG. 4B shows the output peak value of the laser beam pulse is changed from the state in FIG. 4A. FIG. 4C shows the interval of repeated outputs of laser beam pulses is changed from the state in FIG. 4A. FIG. 4D shows the width of the laser beam pulse is changed from the state in FIG. 4A, relating to an example of repeated outputs. The laser oscillator for composing the laser output unit 103 receives the command of machining condition set in the setting unit 101 from the controller 102, and outputs laser beam pulses shown in FIG. 4A, FIG. 4B, FIG. 4C and FIG. 4D. And the laser oscillator outputs a combined laser pulse shown in FIG. 4A, FIG. 4B, FIG. 4C and FIG. 4D.

Figure 5A:
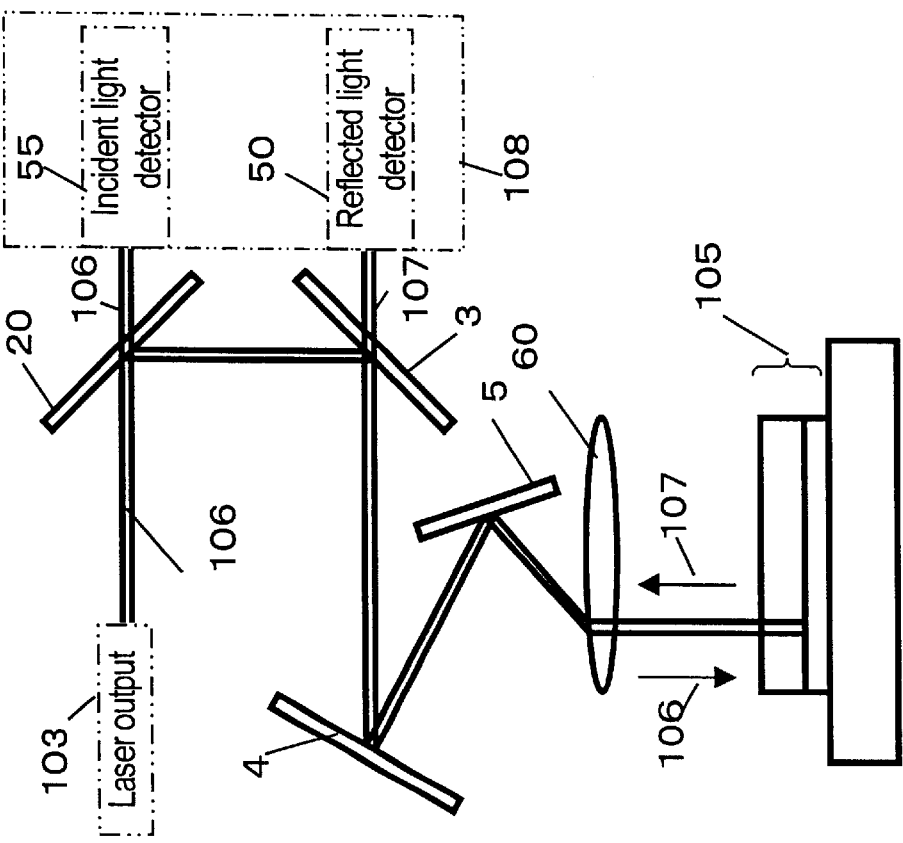
FIG. 5A is a diagram showing an example of optical system for detecting only reflected beam used in a laser machining apparatus.
Figure 5B:
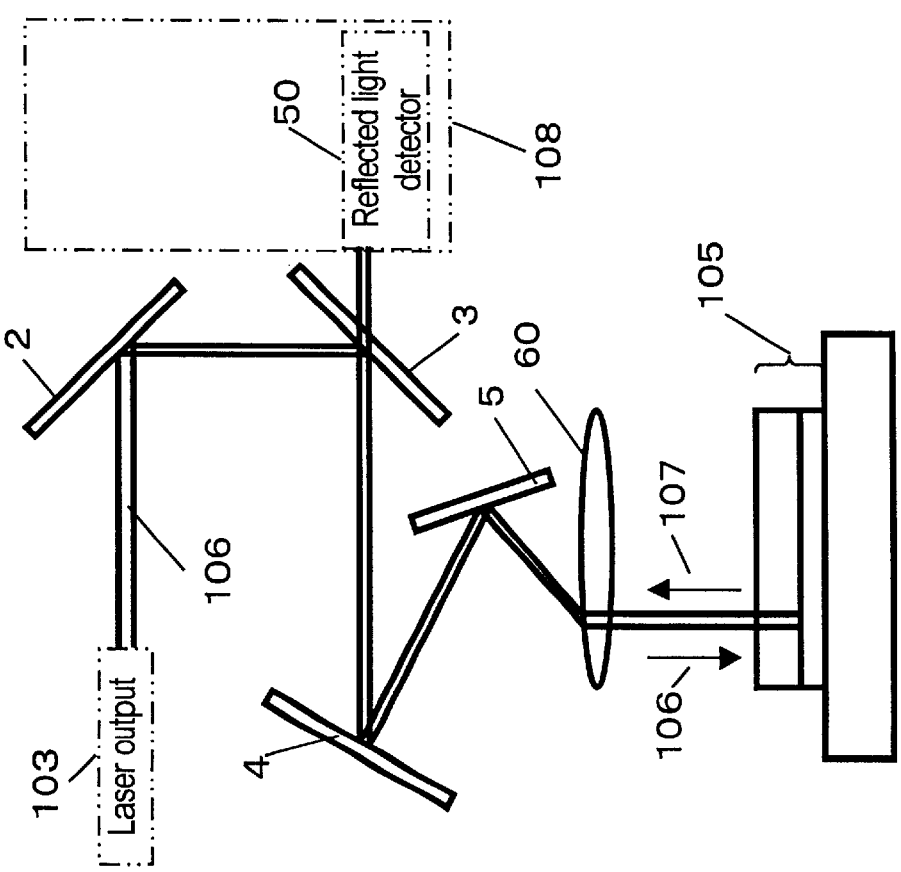
FIG. 5B is a diagram showing an example of optical system for detecting both incident beam and reflected beam used in the laser machining apparatus.

FIG. 5A and FIG. 5B schematically show examples of constitution of the optical system 104 of the embodiment. FIG. 5A shows an example of constitution for detecting the reflected light 107 from the workpiece 105, and for not detecting the laser incident beam 106 outputted from the laser output unit 103 and entering the optical system 104. In FIG. 5A, reference numeral 2 is a first bent mirror, reference numeral 3 is a second bent mirror composed of a beam splitter, reference numeral 4 is a first scanning mirror, reference numeral 5 is a second scanning mirror, reference numeral 108 is a laser light detector including reflected light detector 500, and reference numeral 60 is a focusing lens for machining, and these elements are combined to constitute the optical system 104. FIG. 5B shows an example of constitution for detecting the reflected light 107 from the workpiece 105, and detecting the laser incident beam 106 outputted from the laser output unit 103. In FIG. 5B, reference numeral 20 is a first bent mirror composed of a beam splitter, reference numeral 3 is a second bent mirror composed of a beam splitter, reference numeral 4 is a first scanning mirror, reference numeral 5 is a second scanning mirror, reference numeral 108 is a laser light detector including reflected light detector 500 and incident light detector 550, and reference numeral 60 is a focusing lens for machining, and these elements are combined to constitute the optical system 104. In this constitution, the first scanning mirror 4, second scanning mirror 5, and focusing lens for machining 60 compose a moving mechanism of laser beam for machining a plurality of machining points in entire surface or partial surface of the workpiece without moving the workpiece. In the case of this embodiment, the first scanning mirror 4 and second scanning mirror 5 are constituted so as to scan the laser beam 106, and therefore, substantially, the surface of the workpiece 105 such as circuit board can be scanned two-dimensionally through the focusing lens for machining 60. The first scanning mirror 4 and second scanning mirror 5 are composed of, for example, galvanometer mirrors, and the focusing lens for machining 60 is composed of, for example, an fθ lens. This constitution is a typical structure, and it may be composed of more optical parts or fewer optical parts, or of other optical parts. In any constitution of FIG. 5A or FIG. 5B, the laser incident beam 106 outputted from the laser output unit 103 and entering the optical system 104 is irradiated to the workpiece 105 through the first bent mirror 2 or 20, second bent mirror 3, first scanning mirror 4, second scanning mirror 5, and focusing lens for machining 60. As the workpiece 105 is machined by laser beam, for example, when the conductive layer 105*b* is exposed as shown in FIG. 3C, the incident laser beam 106 is reflected by the conductive layer 105*b* of the workpiece 105 to be reflected laser beam 107, which returns to the laser output unit 103 in the reverse procedure of the incident beam, that is, through the focusing lens for machining 60, second scanning mirror 5, first scanning mirror 4, second bent mirror 3, and first bent mirror 2 or 20. The optical path of the reflected laser beam 107 returning to the laser output unit 103 is approximately close to the optical path of the incident beam 106. During this laser machining, the level of the laser incident beam 106 is detected, in the case of FIG. 5B, as part of it passes through the first bent mirror 20 and is sent to the incident beam detector composed in the laser beam detector 108. The level of the reflected laser beam 107 is detected as part of it passes through the second bent mirror 3 and is sent to the reflected beam detector 500 composed in the laser beam detector 108.

Figure 6:
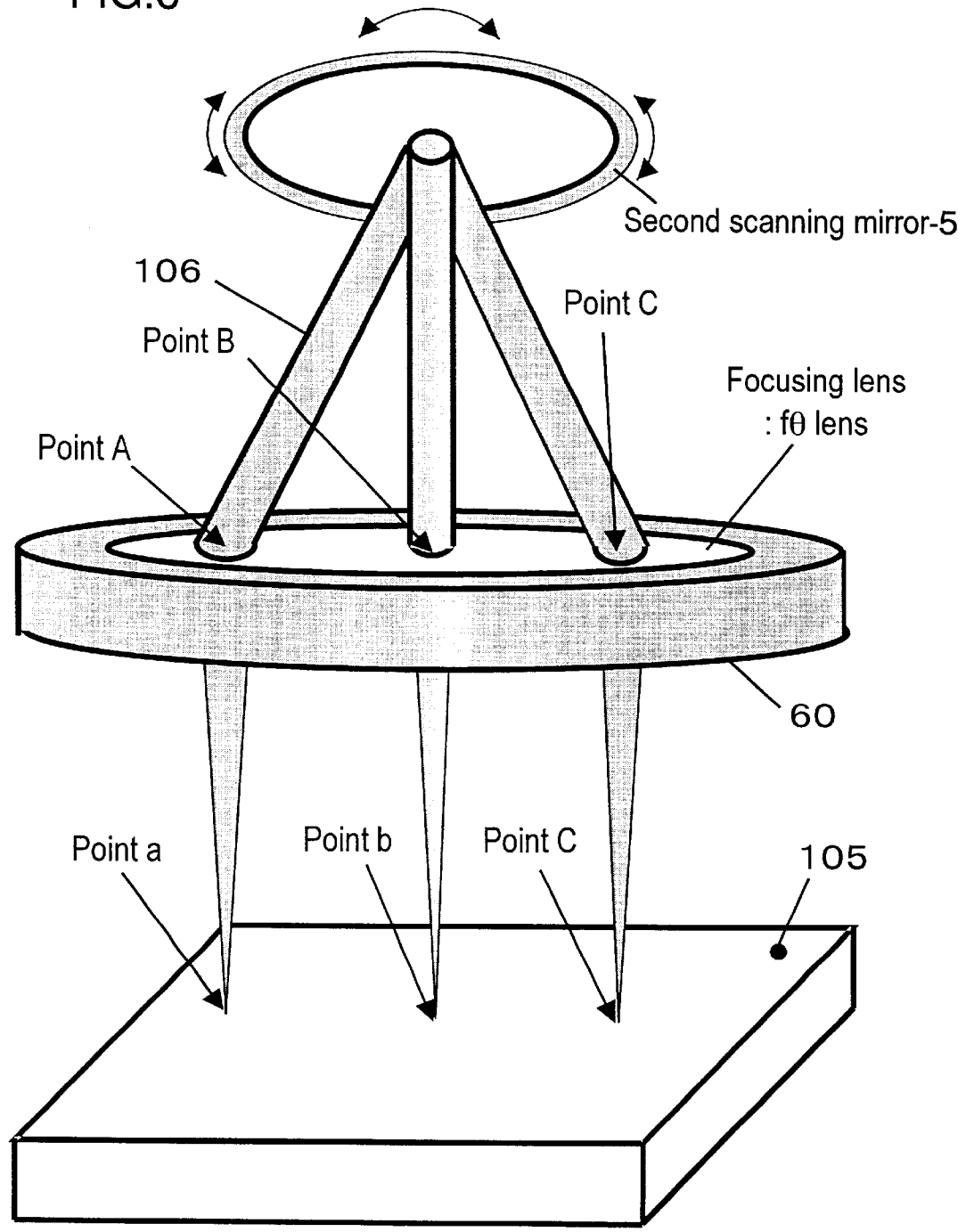
FIG. 6 is an outline drawing showing an example of constitution of focusing lens used in the laser machining apparatus.

An example of constitution of the focusing lens for machining 60 for composing this optical system 104, and an example of laser machining operation are described specifically by referring to FIG. 6. In FIG. 6, reference numeral 60 is an fθ lens, and the incident beam 106 is focused at point (a) of the workpiece 105, from a certain angle of the second scanning mirror 5. For example, through point A of the fθ lens, the point(a) of the workpiece 105 is machined. When machining of the point (a) of the workpiece 105 is over, the angle of the second scanning mirror 5 is changed, for example, through point B of the fθ lens, and beam is focused at point (b) of the workpiece 105 to machine this point. When machining of the point (b) of the workpiece 105 is over, next point, for example, point (c) of the workpiece 105 is machined. In this way, plural points of the workpiece 105 are machined sequentially.

Figure 7A:
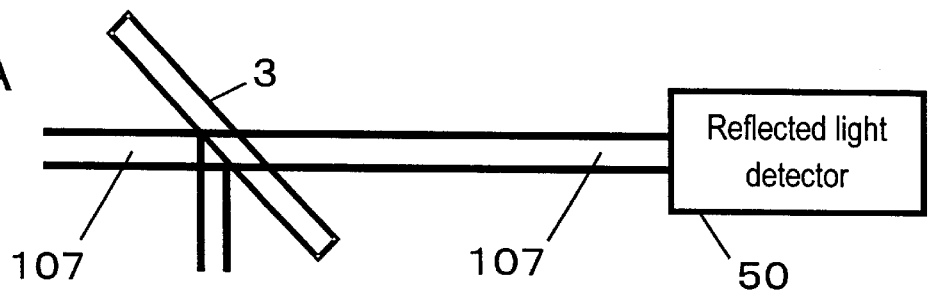
FIG. 7A is a diagram schematically showing a constitution of direct detection of reflected beam.
Figure 7B:
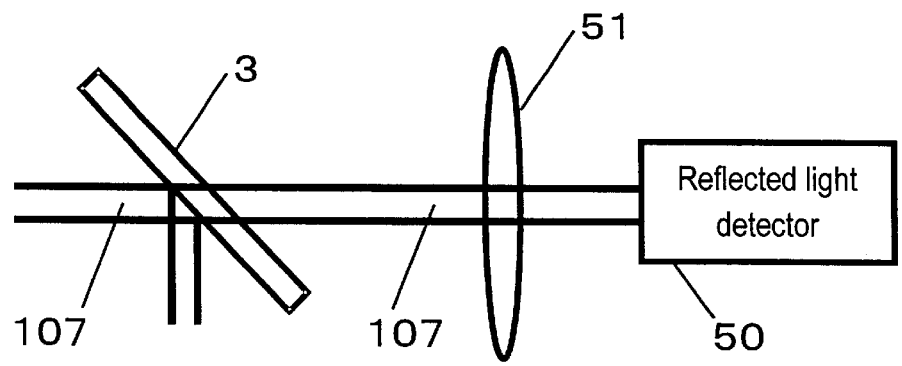
FIG. 7B is a diagram schematically showing a constitution of detection of reflected beam through a focusing lens.
Figure 7C:
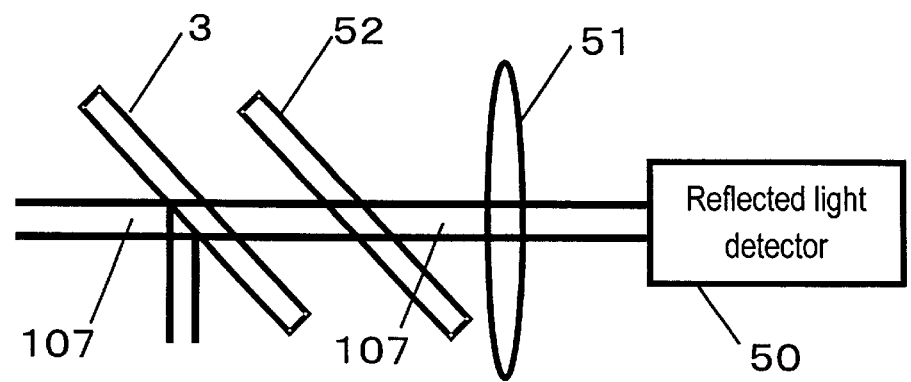
FIG. 7C is a diagram schematically showing a constitution of detection of reflected beam through a beam splitter and a focusing lens.

FIG. 7A, FIG. 7B, and FIG. 7C schematically show the constitution of the laser beam detector 108 of incident laser beam 106 or reflected laser beam 107. In FIG. 7A, for example, part of the reflected laser beam 107 passing through the second bent mirror 3 is directly put into the reflected beam detector 500. In FIG. 7B, for example, part of the reflected laser beam 107 passing through the second bent mirror 3 is put into the reflected beam detector 500 through the focusing lens 510. In FIG. 7C, for example, part of the reflected laser beam 107 passing through the second bent mirror 3 is put into the reflected beam detector 500 by way of the beam splitter 520 and focusing lens 510. Any one of FIG. 7A, FIG. 7B or FIG. 7C may be selected depending on the diameter, intensity or other condition of the laser beam entering this laser beam detector 108.

The constitution for detecting the laser incident beam may be similar to that for detecting the reflected beam described above. The incident beam is detected by detecting the laser beam entering the laser beam detector 108 through the second bent mirror composed of the beam splitter in FIG. 7B.

Therefore, when detecting both incident beam and reflected beam, the laser beam detector 108 is composed of two independent sets of the detectors shown in FIG. 7A, FIG. 7B and FIG. 7C, and when detecting the reflected beam only, it is composed of one set of detector shown in any one of FIG. 7A, FIG. 7B and FIG. 7C.

In this embodiment, the laser oscillator is a pulse laser oscillator, but depending on the workpiece, a laser oscillator may be used continuous wave type laser. In such a case, the laser energy condition, and the output time limiting level may be set beforehand.

In this embodiment, galvanometer mirrors are used as scanning mirrors, but similar effects are obtained by using polygonal mirrors, acousto-optic elements, electro-optic elements, hologram scanners or others.

In this embodiment, the focusing lens for machining 60 is the fθ lens, but similar effects are obtained by the optical system combining a plurality of single lenses or fresnel lenses.

Embodiment 2

Figure 8:
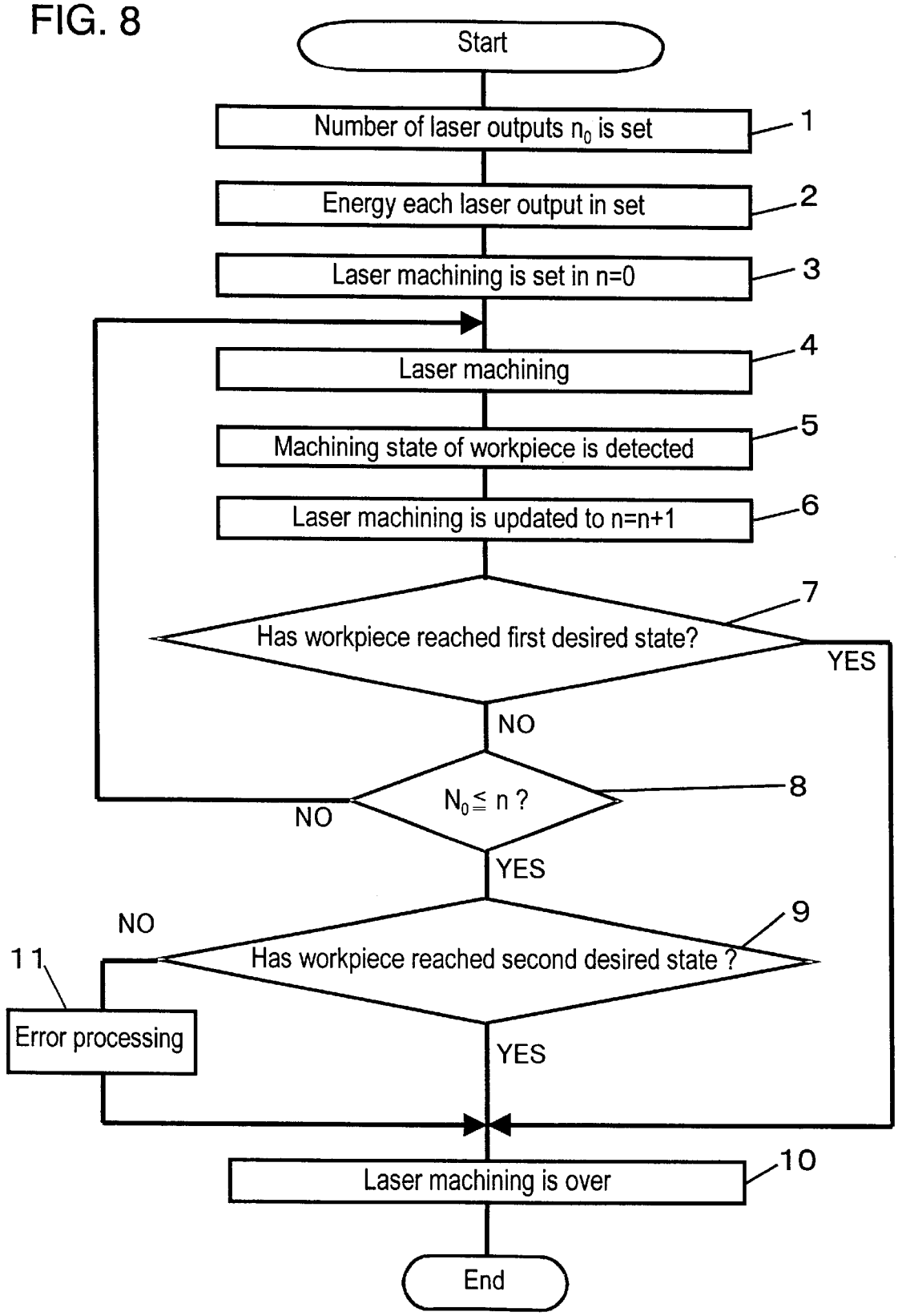
FIG. 8 is a diagram showing a machining flow of a laser machining method of embodiment 2.

Referring now to the drawings, embodiment 2 of the invention is described in detail below. FIG. 8 is a diagram showing machining flow of laser machining method of the embodiment.

In FIG. 8 showing this embodiment, steps 1 to 6, 10 are same as explained in FIG. 1 relating to embodiment 1, and duplicate explanation is omitted.

Characteristic points of this embodiment are described below.

Step 7: The detection result of the machining state of the workpiece at step 5 is judged, whether the workpiece has reached a first predetermined desired machining state or not. When reaching the first desired machining state as a result of judgement, laser machining is finished.

Step 8: If not reaching the first desired machining state as a result of judgement at step 7, the number of output pulses set at step 1 and the number of laser beam machining pulses counted at step 6 is compared. As a result of comparison, if not reaching the number of output pulses set at step 1, back to step 4. The laser pulse machining, detection of machining state, counting of number of machining laser pulses, and judgement of machining state are repeated in the determined condition.

Step 9: When the workpiece has not reached the first desired machining state as a result of judgement at step 7 and the number of machining laser pulses counted at step 6 has reached the number of output pulses set at step 1, the machining state at the moment is judged. The judgement depends on whether reaching or not a predetermined second desired machining state.

As a result of judgement, if reaching the second desired machining state, laser machining is finished.

Step 10: When reaching the first desired machining state or second desired machining state as judged at step 7 and step 9, laser machining is finished.

Thus, according to this embodiment, by finishing the process when the workpiece has reached the desired machining state before the number of times of laser machining reaches the set number of laser outputs, holes of high quality are drilled at high yield, and the machining cycle time is shortened.

Herein, comparing the first desired machining state and second desired machining state, the first desired machining state is advanced from the second desired machining state . The first desired machining state is set in the state less than the allowable upper limit of machining, and the second desired machining state is set in the state more than the allowable lower limit of machining.

Step 11: When the result judged at step 9 has not reached the second desired machining state, the hole is processed as a machining error.

Figure 9:
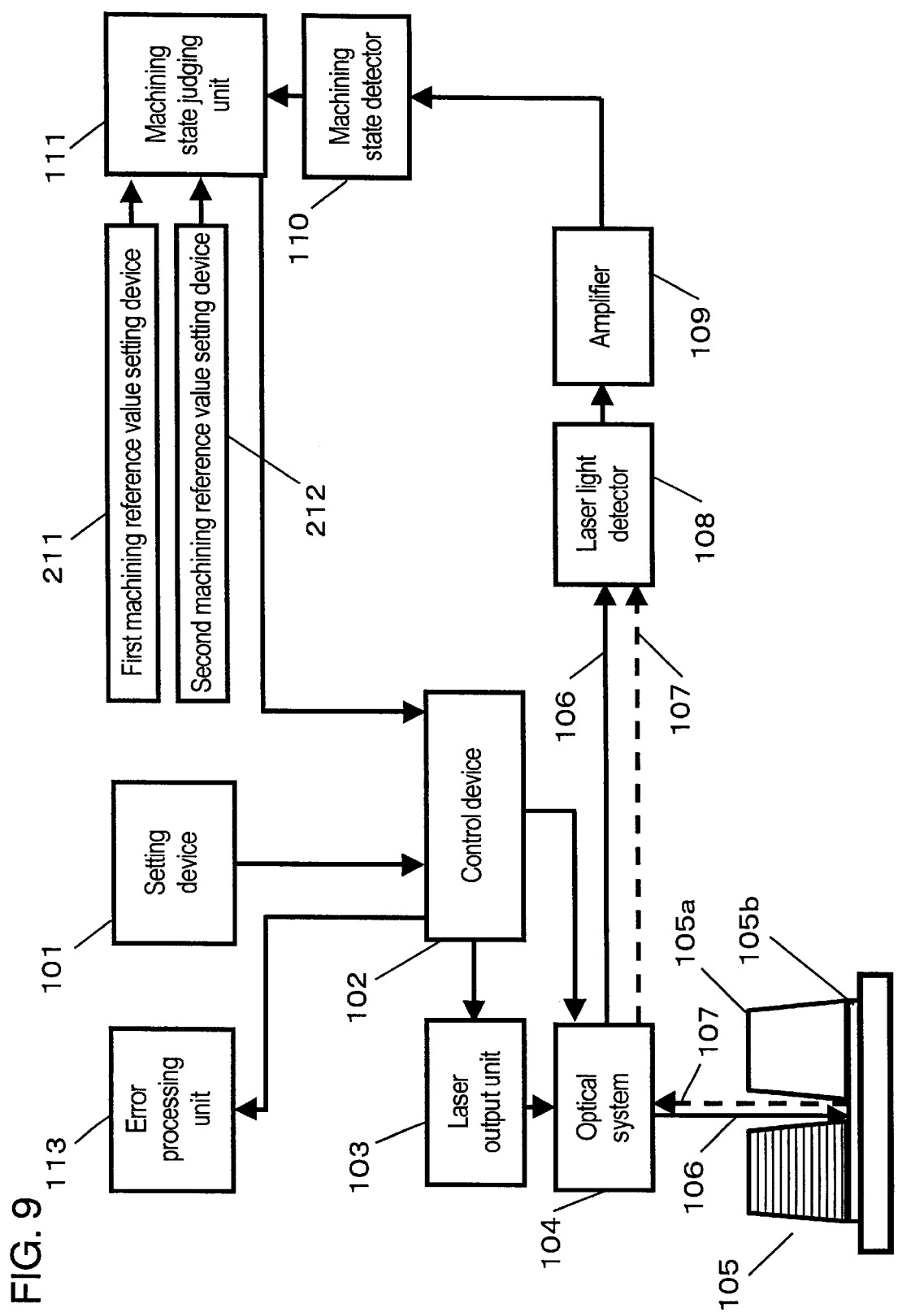
FIG. 9 is an outline drawing explaining a method of detecting machining state, a laser machining method, and a constitution of a laser machining apparatus in embodiment 2.

FIG. 9 is an outline drawing showing the method of detecting the machining state of workpiece and the laser machining method.

In FIG. 9 showing the embodiment, reference numerals 101 to 111, and 113 are same as in FIG. 2 relating to embodiment 1, and duplicate description is omitted.

Reference numeral 211 is a first machining reference value setting unit, and reference numeral 212 is a second machining reference value setting unit.

In the machining state judging unit 111, the reference value preset in the first machining reference value setting unit 211 and the normalizing signal sent from the machining state detector are compared, and the pulse machining state is judged.

As for the machining reference value, from the relation between the normalizing value and the hole drilled in the workpiece, that is, the exposed area of the conductive layer 105b, the normalizing value is larger when the conductive layer 105b is wider in area. Accordingly, the normalizing value corresponding to the desired hole is set, and when exceeding this reference value, it is judged that the desired hole is exceeded, and if lower than this reference value, it is judged not reaching the desired hole. Such judgement is transmitted to the controller 102.

When reaching the desired hole, the controller 102 finishes pulse machining if the number of times of laser machining has not reached the value set in the setting unit 101.

Thus, according to this embodiment, by finishing the process when the workpiece has reached the desired machining state before the number of times of laser machining reaches the set number of laser outputs, holes of high quality are drilled at high yield, and the machining cycle time is shortened.

If not reaching the desired hole, to the contrary, laser machining is continued. The laser machining and machining state judgement are repeated up to the number of output pulses set in the setting unit 101.

The controller 102 has a function of counting the number of pulses of laser machining, and also has a function (not shown) of comparing with the number of output pulses set in the setting unit 101. The machining state judging unit 111 judges the pulse machining state by comparing preliminarily the reference value set in the first machining reference value setting unit 211 and the normalizing signal transmitted from the machining state detector 110, and also judges the pulse machining state by comparing preliminarily the reference value set in the second machining reference value setting unit 212 and the normalizing signal transmitted from the machining state detector 110. This judgement is sent to the controller 102 in every one pulse laser machining. The result is judged when the number of laser machining processes has reached the number of output pulses set in the setting unit 101 (final pulse). That is, after output of the final laser pulse, the reference value set in the second machining reference value setting unit 212 and the normalizing signal transmitted from the machining state detector 110 are compared, and machining is finished when judged to have reached the second desired machining state. If not reaching the desired machining state, it is judged to be an error.

The relation of the first desired machining state and second desired machining state is as mentioned above.

The error processing unit 113 is intended to discard the workpiece not reaching the desired machining state, and start next pulse machining. Or, by storing the coordinates of the pulse drilled hole not reaching the desired pulse machining state, the position may be machined later, or discarded in a later process.

This machining is set in the setting unit 101, but if the laser energy conditions necessary for machining of workpiece such as the laser output per 1 pulse of output pulse, pulse width, and pulse interval are identical in each output pulse, it is not necessary to detect the incident laser beam 106 by the laser beam detector 108. This point is same as explained in embodiment 1, and duplicate description is omitted.

By operating in such process, the insulating layer of the workpiece can be machined precisely as desired.

The laser machining method of this embodiment is described so far, and the laser output unit 103, optical system 104, and laser beam detector 108 for composing the embodiment are same as in embodiment 1 of the invention.

In this embodiment, same as in embodiment 1, the laser oscillator is a pulse laser oscillator, but depending on the workpiece, a laser oscillator may be used continuous wave type laser. In such a case, the laser energy condition, and the output time limiting level may be set beforehand.

In the embodiment, galvanometer mirrors are used as scanning mirrors, but similar effects are obtained by using polygonal mirrors, acousto-optic elements, electro-optic elements, hologram scanners or others.

In the embodiment, the focusing lens for machining 60 is the fθ lens, but similar effects are obtained by the optical system combining a plurality of single lenses or Fresnel lenses.

Embodiment 3

Figure 10:
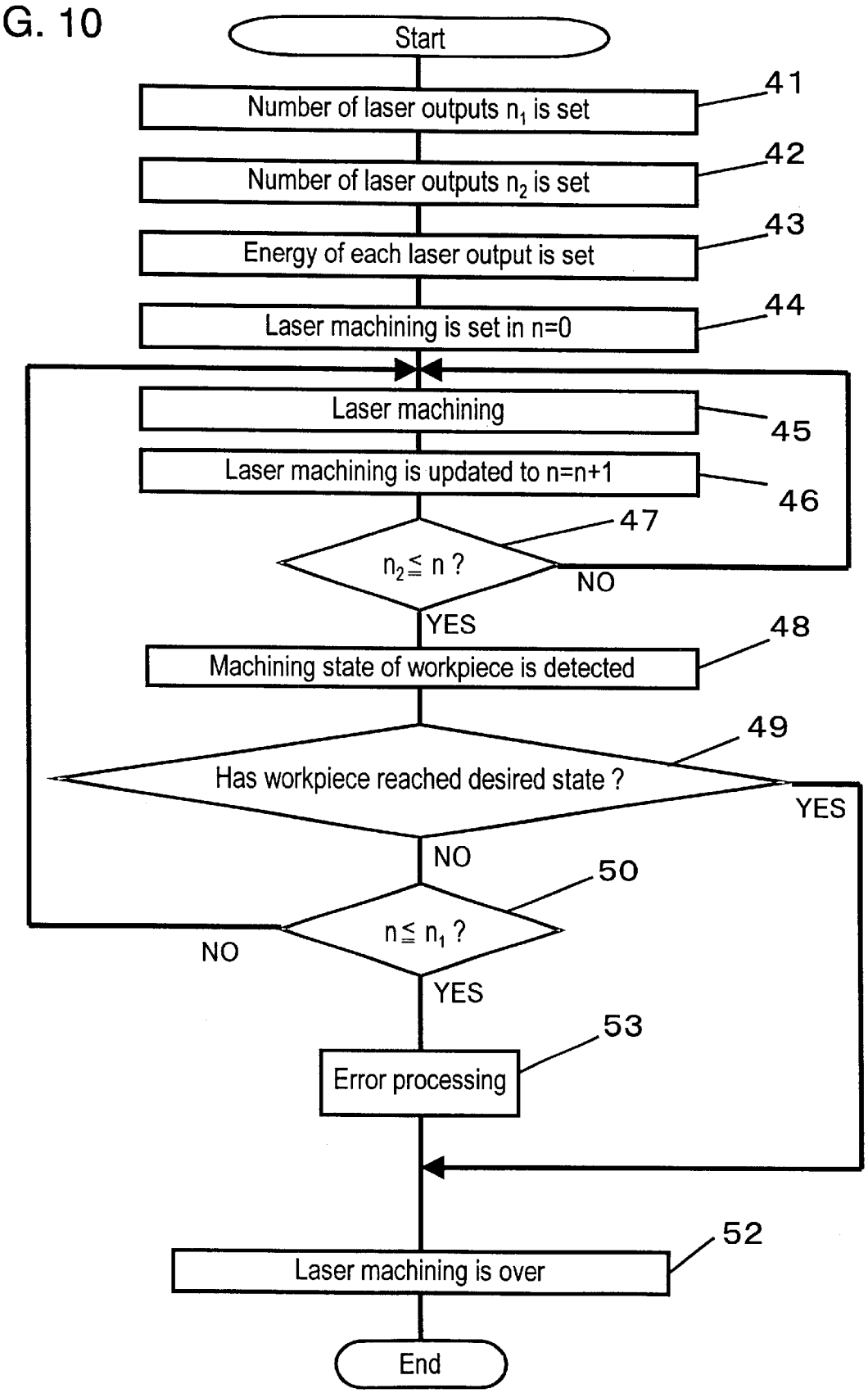
FIG. 10 is a diagram showing a machining flow of a laser machining method of embodiment 3.

Referring now to the drawings, embodiment 3 of the invention is described in detail below. FIG. 10 is a diagram showing machining flow of laser machining method of the embodiment.

Step 41: The first number of laser output pulses is set up.

Step 42: The second number of laser output pulses is set up.

Step 43: The laser energy condition necessary for machining of the workpiece is set up. The laser energy condition is such as laser output per 1 pulse of output pulse, pulse width, and pulse interval. In this setting, including the number of output pulses at step 1, the condition is set for machining the workpiece securely. For example, the energy per 1 laser pulse is set at 10 mJ, and the number of output pulses is 3. Or the energy may be changed in every one laser pulse, such as 2 output pulses of 10 mJ, or 2 output pulses of 5 mJ.

Step 44: Before execution of laser machining, the number of counter is set up in 0. The counter has the function which counts the number of pulses of laser machining.

Step 45: One laser pulse beam irradiates to the workpiece in the laser energy condition set at step 43, and laser machining is executed by irradiating.

Step 46: The number of pulses of laser pulse beam irradiated to the workpiece is counted.

Step 47: The arrival at the second number of laser pulse outputs set at step 42 is judged.

Step 48: The machining state of the workpiece by laser machining at step 45 is detected.

Step 49: The detection result of the machining state of the workpiece at step 48 is judged, whether the workpiece has reached a predetermined desired machining state or not. When reaching the desired machining state as a result of judgement, laser machining is finished.

Step 50: If not reaching the desired machining state as a result of judgement at step 49, the number of output pulses set at step 41 and the number of laser beam machining pulses counted at step 46 is compared. As a result of comparison, if not reaching the number of output pulses set at step 41, back to step 45, the laser pulse machining, detection of machining state, counting of number of machining laser pulses, and judgement of machining state are repeated in the determined condition.

Step 52: When reaching the desired machining state as judged at step 49, laser machining is finished.

Thus, according to this embodiment, by finishing the process when the workpiece has reached the desired machining state before the number of times of laser machining reaches the set number of laser outputs, holes of high quality are drilled at high yield, and the machining cycle time is shortened.

Step 53: When the result of the workpiece judged at step 49 has not reached the desired machining state and the number of machining laser pulses counted at step 50 has reached the number of output pulses set at step 41, the hole is processed as a machining error.

Herein, the desired machining state is set somewhere between the state of less than the allowable upper limit of machining and the state more than the allowable lower limit of machining.

The detecting method of machining state of workpiece, and laser machining method are described below.

Figure 11:
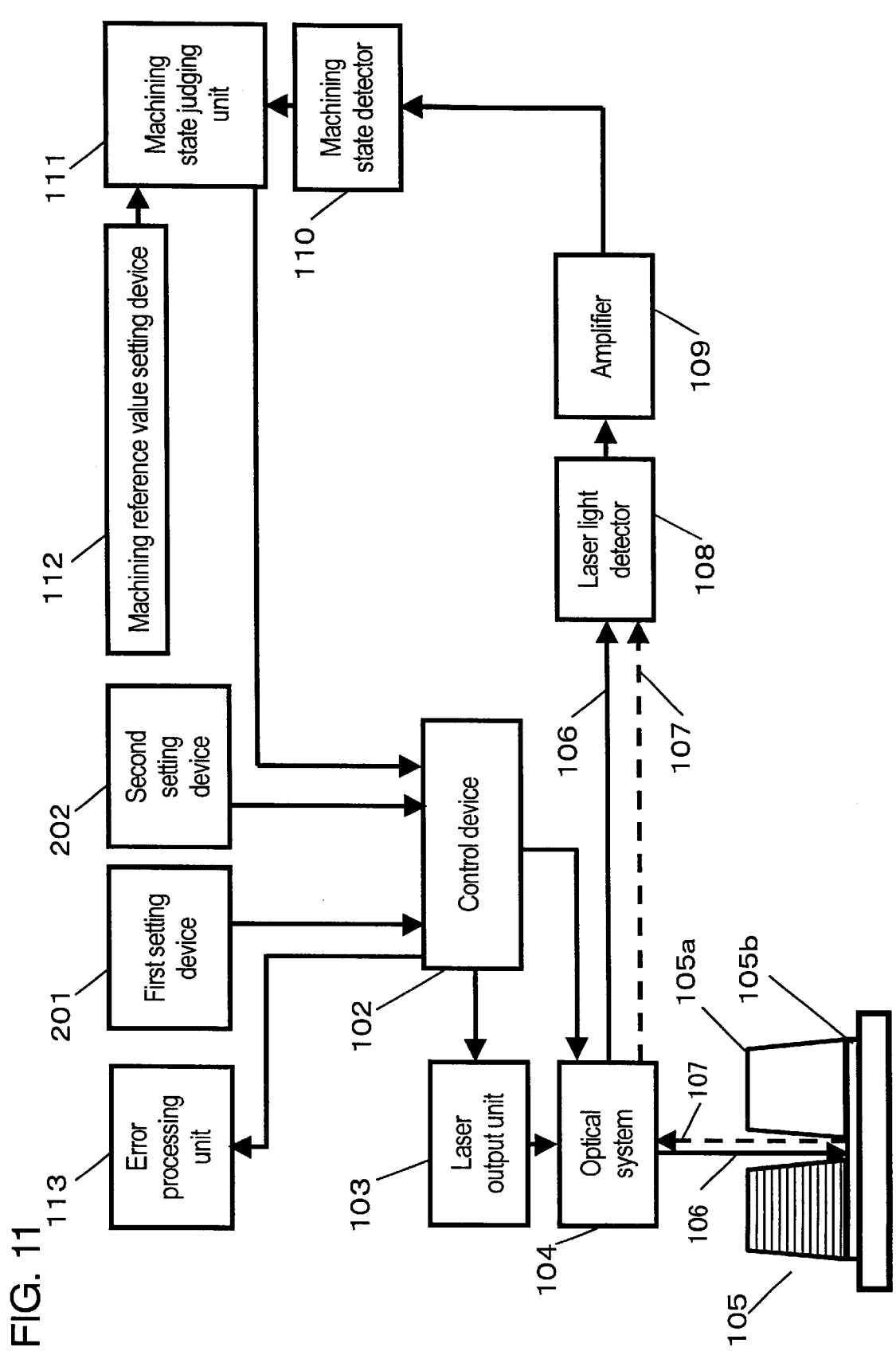
FIG. 11 is an outline drawing explaining a method of detecting machining state, a laser machining method, and a constitution of a laser machining apparatus in embodiment 3.

FIG. 11 is an outline drawing showing the method of detecting the machining state of workpiece and the laser machining method.

In FIG. 11 showing the embodiment, reference numerals 102 to 113 are same as in FIG. 2 relating to embodiment 1, and duplicate description is omitted.

Reference numeral 201 is a first setting unit for setting the first number of laser output pulses, and reference numeral 202 is a second setting unit for setting the second number of laser output pulses.

In this constitution, the operation for this detecting method is described in detail below.

First, the first setting unit 201 sets the laser energy condition necessary for machining of workpiece such as the laser output per 1 pulse, pulse width, and pulse interval, and the number of laser output pulses. The laser energy condition and the number of laser output pulses to be set herein are the conditions for machining the workpiece securely. Next, the second setting unit 202 sets the laser energy condition necessary for machining of workpiece such as the laser output per 1 pulse, pulse width, and pulse interval, and the number of laser output pulses. The laser energy condition and the number of laser outputs to be set herein are the condition for machining the workpiece such as circuit board, so that the workpiece begins to reach the desired machining state, that is, the exposed area of the conductor layer beneath the insulating layer begins to reach the desired area.

The controller 102 first controls the laser output unit 103 by the second setting unit 202. At this time, the operation of the machining state detector 110 and machining state judging unit 111 is stopped. From the final laser pulse output of the number of outputs set in the second setting unit 202, the machining state detector 110 and machining state judging unit 111 are put into operation. Hereinafter, the operation of laser machining up to the number of laser pulse outputs set in the first setting unit 201 is same as the detecting method of machining state and machining method of embodiment 2 of this invention.

Thus, according to this embodiment, by finishing the process when the workpiece has reached the desired machining state before the number of times of laser machining reaches the set number of laser outputs, holes of high quality are drilled at high yield, and the machining cycle time is shortened.

This machining is set in the first setting unit 201 and second setting unit 202, but if the laser energy conditions necessary for machining of workpiece such as the laser output per 1 pulse, pulse width, and pulse interval are identical in each output pulse, it is not necessary to detect the incident laser beam 106 by the laser beam detector 108. This point is same as explained in embodiment 1, and duplicate description is omitted.

By operating in such process, the insulating layer of the workpiece can be machined precisely as desired.

The laser machining method of the embodiment is described so far, and the laser output unit 103, optical system 104, and laser beam detector 108 for composing the embodiment are same as in embodiment 1 of this invention.

In this embodiment, the laser oscillator is a pulse laser oscillator, but depending on the workpiece, a laser oscillator may be used continuous wave type laser. In such a case, the laser energy condition, and the output time limiting level may be set beforehand.

In this embodiment, galvanometer mirrors are used as scanning mirrors, but similar effects are obtained by using polygonal mirrors, acousto-optic elements, electro-optic elements, hologram scanners or others.

In this embodiment, the focusing lens for machining 60 is the fθ lens, but similar effects are obtained by the optical system combining a plurality of single lenses or fresnel lenses.

Embodiment 4

Figure 12:
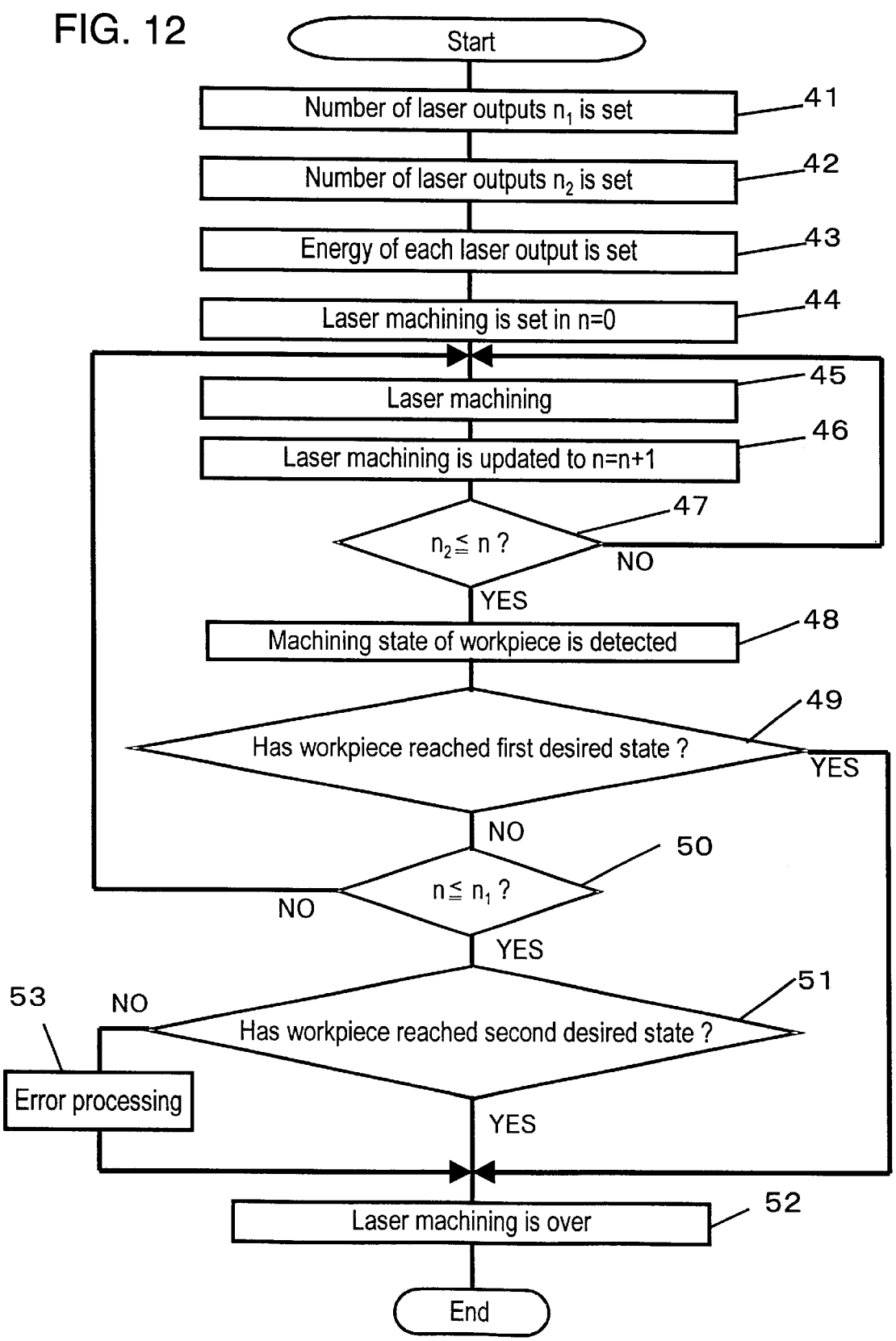
FIG. 12 is a diagram showing a machining flow of a laser machining method of embodiment 4.

Referring now to the drawings, embodiment 4 of this invention is described in detail below. FIG. 12 is a diagram showing machining flow of laser machining method of the embodiment.

In FIG. 12 showing this embodiment, steps 41 to 48, and 53 are same as explained in FIG. 10 relating to embodiment 3, and duplicate explanation is omitted. Characteristic points of the embodiment are described below.

Step 49: The detection result of the machining state of the workpiece at step 48 is judged, whether the workpiece has reached a first predetermined desired machining state or not. When reaching the first desired machining state as a result of judgement, laser machining is finished.

If not reaching the first desired machining state, laser machining is continued in the laser energy condition set at step 41, and the machining state of the workpiece is detected in every one pulse of laser machining, judging if reaching the first desired machining state or not.

Step 50: The number of output pulses set at step 41 and the number of laser beam machining pulses counted at step 46 is compared, if not reaching the first desired machining state as a result of judgement at step 49. As a result of comparison, if not reaching the number of output pulses set at step 41, back to step 45, and the laser pulse machining, detection of machining state, counting of number of machining laser pulses, and judgement of machining state are repeated in the determined condition.

Step 51: When the workpiece has not reached the first desired machining state as a result of judgement at step 49 and the number of machining laser pulses counted at step 50 has reached the number of output pulses set at step 41, the machining state at the moment is judged. The judgement depends on whether reaching or not a predetermined second desired machining state. As a result of judgement, if reaching the second desired machining state, laser machining is finished.

Step 52: When reaching the first desired machining state or second desired machining state as judged at step 49 and step 51, laser machining is finished.

Thus, according to the embodiment, by finishing the process when the workpiece has reached the desired machining state before the number of times of laser machining reaches the set number of laser outputs, holes of high quality are drilled at high yield, and the machining cycle time is shortened.

Herein, comparing the first desired machining state and second desired machining state, the first desired machining state is advanced from the second desired machining state. The first desired machining state is set in the state less than the allowable upper limit of machining, and the second desired machining state is set in the state more than the allowable lower limit of machining.

Figure 13:
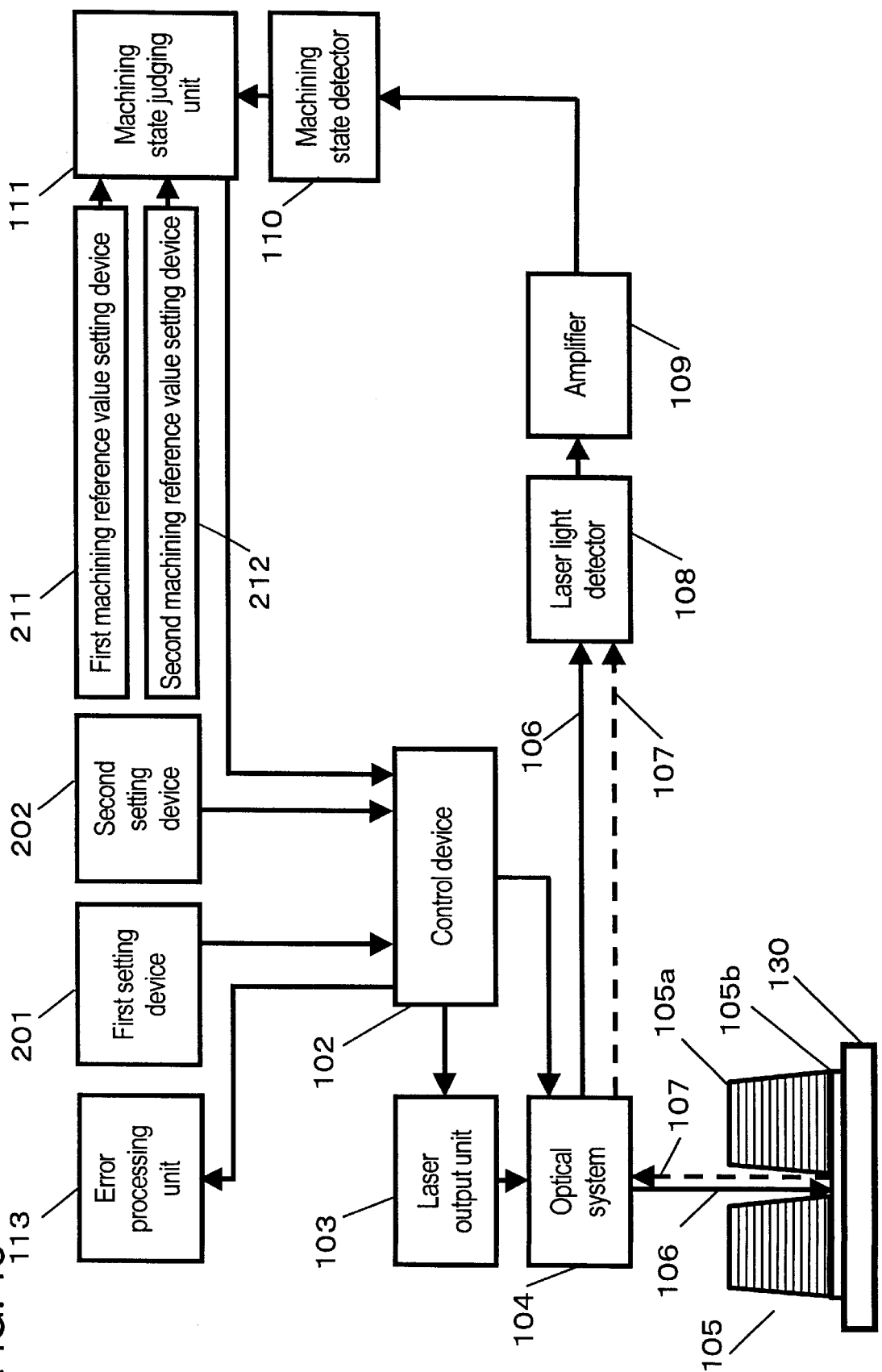
FIG. 13 is an outline drawing explaining a method of detecting machining state, a laser machining method, and a constitution of a laser machining apparatus in embodiment 4.

FIG. 13 is an outline drawing showing the method of detecting the machining state of workpiece and the laser machining method.

In FIG. 13 showing this embodiment, reference numerals 102 to 110, 113, 201 and 202 are same as in FIG. 10 relating to embodiment 3, and duplicate description is omitted.

FIG. 13 is similar to FIG. 11 schematically showing the detecting method of machining state of workpiece, in which the machining reference value setting unit 112 is replaced by a first machining reference value setting unit 211 and a second machining reference value setting unit 212.

In this constitution, the operation of this detecting method is specifically described below.

The operation of laser machining up to the first setting unit 201 is same as the detecting method of machining state in embodiment 3.

According to this embodiment, by finishing the process when the workpiece has reached the desired machining state before the number of times of laser machining reaches the set number of laser outputs, holes of high quality are drilled at high yield, and the machining cycle time is shortened.

The controller 102 has a function of counting the number of pulses of laser machining, and also has a function (not shown) of comparing with the number of output pulses set in the first setting unit 201. The machining state judging unit 111 judges the pulse machining state by comparing preliminarily the reference value set in the first machining reference value setting unit 211 and the normalizing signal transmitted from the machining state detector 110, and also judges the pulse machining state by comparing preliminarily the reference value set in the second machining reference value setting unit 212 and the normalizing signal transmitted from the machining state detector. This judgement is sent to the controller 102 in every process of laser pulse machining. The result is judged when the number of laser machining processes has reached the number of output pulses set in the first setting unit 201. That is, the reference value set in the second machining reference value setting unit 212 and the normalizing signal transmitted from the machining state detector 110 are compared, and machining is finished when judged to have reached the desired machining state. If not reaching the desired machining state, it is judged to be an error.

This machining is set in the first setting unit 201 and second setting unit 202, but if the laser energy conditions necessary for machining of workpiece such as the laser output per 1 pulse, pulse width, and pulse interval are identical in each output pulse, it is not necessary to detect the incident laser beam 106 by the laser beam detector 108. This point is same as explained in embodiment 1, and duplicate description is omitted.

By operating in such process, the insulating layer of the workpiece can be machined precisely as desired.

The laser machining method of the embodiment is described so far, and the laser output unit 103, optical system 104, and laser beam detector 108 for composing the constitution are same as in embodiment 1 of the invention.

In this embodiment, same as in embodiment 1, the laser oscillator is a pulse laser oscillator, but depending on the workpiece, a laser oscillator for irradiating laser beam continuously may be used. In such a case, the laser energy condition, and the output time limiting level may be set beforehand.

In the embodiment, same as in embodiment 1, galvanometer mirrors are used as scanning mirrors, but similar effects are obtained by using polygonal mirrors, acousto-optic elements, electro-optic elements, hologram scanners or others.

In the embodiment, the focusing lens for machining 60 is the fθ lens, but similar effects are obtained by the optical system combining a plurality of single lenses or fresnel lenses.

Embodiment 5

When laser beam passes through a focusing lens for machining, in the case of machining the central part of the machining area by a scanning mirror, the laser beam is irradiated vertical to the workpiece, but in the case of machining the peripheral part, the laser beam is not irradiated vertically to the workpiece, and the laser beam reflected from the workpiece may be dislocated from the intermediate optical system parts, or may be irradiated to the optical parts holding portion, and the laser beam reflected from the workpiece may be diffused on the way, and part of the reflected beam may not reach the reflected beam detector. And as a result, none of the reflected laser beam can be detected, and detection of reflected beam is imperfect, thereby lowering the precision of judgement of machining state of drilled holes.

Or, if the table on which the workpiece is mounted is inclined, similarly, part of the laser beam reflected from the workpiece may not return to the detector of laser beam due to scattering. As a result, the reflected beam is not detected accurately, and the precision of judgement of processing state of drilled holes is lowered.

In the beam of the above problems, it is an object of embodiment 5 of the invention to present a machining state detecting method for drilling holes at high quality, and a machining method, capable of detecting the laser beam reflected from the workpiece by a detector, correcting the intensity signal of the detected laser beam, calculating the intensity of the laser beam reflected from the workpiece accurately, and detecting the machining state of drilled holes accurately.

Embodiment 5 of the invention is described specifically below while referring to the accompanying drawing.

Figure 14:
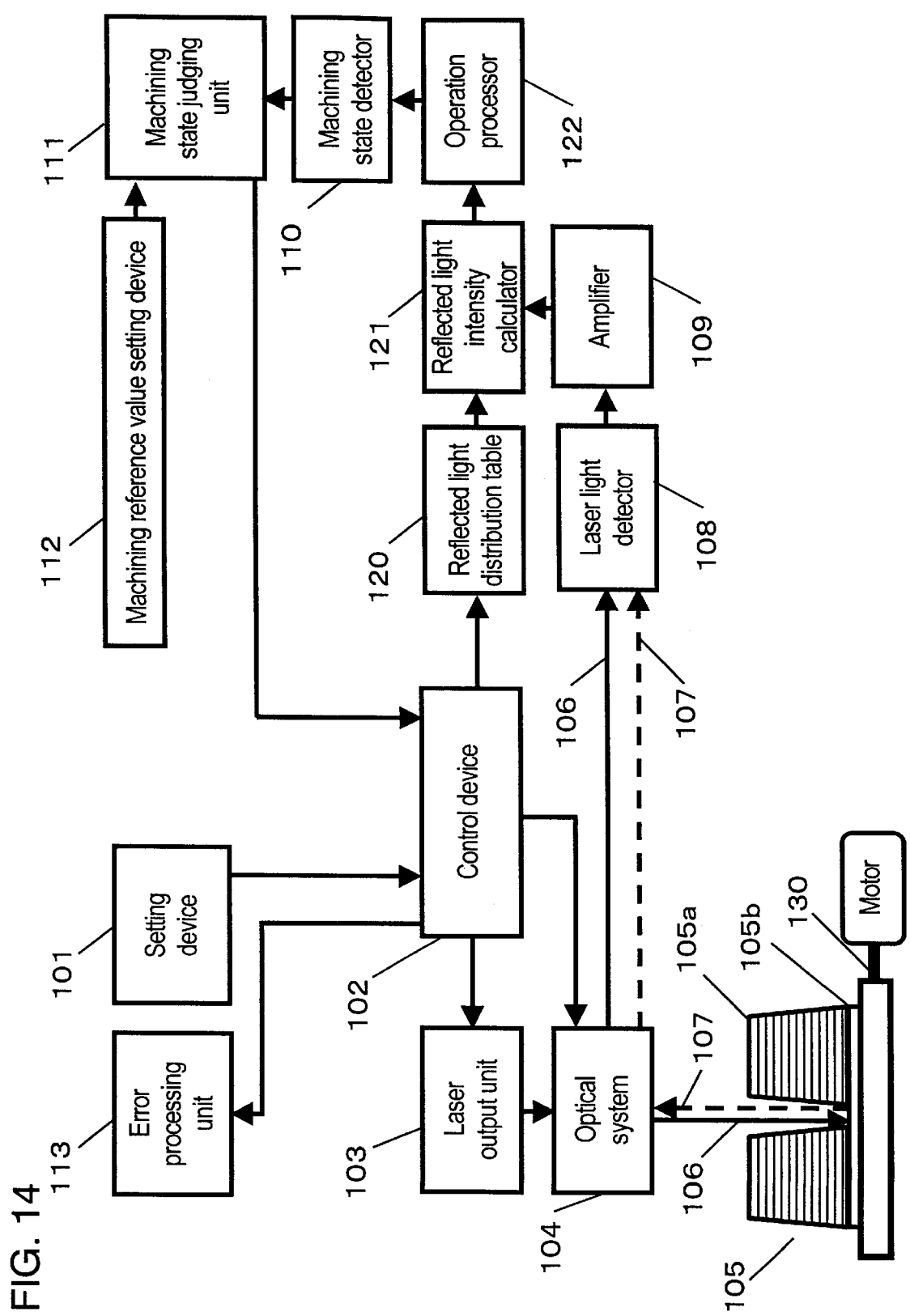
FIG. 14 is an outline drawing explaining a method of detecting machining state, a laser machining method, and a constitution of a laser machining apparatus in embodiment 5.

FIG. 14 showing the embodiment is the constitution adding a reflected beam distribution table 120, a reflected beam intensity calculator 121, and an operation processor 122 to FIG. 2 showing embodiment 1.

In this constitution, the machining state detecting method and machining method of the embodiment are described in detail below.

In FIG. 14 showing the embodiment, units 101 to 113 are same as explained in FIG. 2 relating to embodiment 1, and duplicate description is omitted.

In FIG. 14, reference numeral 120 is a reflected beam distribution table storing the rate of reflected beam of the reflected laser beam 107 reflected from the workpiece 105 returning to the reflected beam detector composed inside of the laser beam detector 108, corresponding to the machining position of the workpiece. Reference numeral 121 is a reflected beam intensity calculator, and reference numeral 122 is an operation processor. This reflected beam distribution table 120 is used for correction for calculation of reflected beam intensity. Reference numeral 130 is a moving mechanism for mounting and is a moving mechanism for moving the workpiece 105.

Herein, the necessity of correction is explained. The workpiece such as circuit board, generally has multiple machining points for removing the insulating layer. For example, when machining of one point is over, a next point must be machined.

For this method, first, the workpiece is fixed on a movable structure, and this movable structure (for example, the moving mechanism 130 shown in FIG. 14) is moved to a specified position. In this case, from the laser output unit 103 to the machining point of the workpiece 105, there is the optical system 104 for guiding always the same laser beam, in the same optical path and in the same length.

That is, so far as the optical path is not moving, generally, it is not necessary to correct. It means that the output of the laser output unit is not changed, and that the moving mechanism is maintained vertical to the laser beam.

In other method, within a certain area range, the optical system for guiding the laser beam is composed, and it is moved to a specified position within the mechanism, without moving the workpiece. This is the method of moving the optical parts for composing the optical system 104 for guiding the laser beam, from the laser output unit 103 to the machining point of the workpiece 105, in which the optical path varies and the optical path length is different. Therefore, the reflected laser beam 107 from the workpiece may not return to the laser beam detector 108 when the quantity of beam reflected by the conductive layer 105*b* of the workpiece partly scatters.

In such a case, preliminarily, the returning rate of the reflected laser beam 107 depending on the pulse machining position of the workpiece 105 is prepared in the table, and the reflected beam intensity is corrected at the coordinates of every pulse machining position.

The detail is explained in FIG. 14. In FIG. 14, reference numeral 120 is the reflected beam distribution table storing the rate of reflected beam of the reflected laser beam 107 from the workpiece returning to the laser beam detector 108, corresponding to the coordinates of the machining positions of the workpiece. Reference numeral 121 is the reflected beam intensity calculator for correcting the reflected beam from the data from the reflected beam distribution table 120 issued depending on the machining position information from the controller 102 and the output of the amplifier 109. Reference numeral 122 is an operation processor for operating by using the output signal from the reflected beam intensity calculator 121. The data of this operation processor 122 is sent to the machining state detector 110. This data is the corrected data.

Explaining this correction operation, if the reflected laser beam 107 from the workpiece does not completely return to the laser beam detector 108 when the quantity of beam reflected by the conductive layer 105*b* of the workpiece partly scatters, preliminarily, the returning rate of the reflected laser beam 107 depending on the pulse machining position of the workpiece 105 is prepared in the table. And the reflected beam intensity is corrected in the coordinates of every pulse machining position. For example, when drilling a hole in certain coordinates, supposing the returning rate of the reflected laser beam from the coordinates is 80%, if the signal detected in the laser beam detector is 8 V, 8 V is divided by the returning rate of reflected beam, 8/0.8, and the detection signal of the reflected beam is corrected to be 10 V.

According to the constitution having such reflected beam correction function, the operation of this detecting method is more specifically described below.

To begin with, the setting unit 101 sets the laser energy condition necessary for machining of the workpiece such as the laser output in every 1 pulse of output pulse, pulse width, and pulse interval, and the number of laser output pulses. The laser energy condition and the number of laser output pulses being set herein are the condition for machining the workpiece securely. Next, this pulse machining condition is transmitted to the controller 102. The controller 102 indicates that the pulse machining condition is outputted in the output unit 103. The laser output unit 103 according to the pulse machining condition of the setting unit 101 outputs the laser beam 106. The laser beam 106 is guided into the workpiece 105 such as circuit board by the optical system 104, and part of the laser beam 106 is led into the laser beam detector 108, and the laser beam guided into the workpiece machines the insulating layer 105*a* of the workpiece 105. such as circuit board. When the conductive layer 105*b* of the workpiece 105 is not exposed, the laser beam 106 is absorbed in the insulating layer 105*a*. As pulse machining advances, the conductive layer 105*b* beneath the insulating layer is exposed, and, at the same time, part of the laser beam irradiated to the workpiece 105, that is, the laser beam reaching up to the conductive layer 105*b* is reflected to be reflected laser beam 107, which runs reversely in the laser optical path. In an intermediate optical system, the reflected laser beam 107 is separated, and is guided into the laser beam detector 108. In the laser beam detector 108, the laser beam, that is, part of the incident laser beam 106 and part of the reflected laser beam 107 are detected, and an incident beam intensity signal and a reflected beam intensity signal are transmitted to the amplifier 109.

The amplifier 109 amplifies the incident beam intensity signal and reflected beam intensity signal. The amplified signals are sent into the reflected beam intensity calculator 121. The reflected beam intensity calculator 121 extracts the rate of the reflected laser beam of the machined workpiece 105 from the machining position information of the workpiece 105 from the controller 102 and the data stored in the reflected beam distribution table 120. For example, the reflected beam distribution table 120 stores the rate of the beam returning to the reflected beam detector at every pitch of 1 mm of the machining position of the workpiece 105. Supposing the machined position to be X=2.5 mm, Y=1 mm, the reflected beam returning rate of X=2 mm, Y=1 mm, for example, 0.99, and the reflected beam returning rate of X=3 mm, Y=1 mm, for example, 0.97 are extracted from the reflected beam distribution table 120, and the two points are interpolated.

By proportional interpolation, for example, the reflected beam returning rate of X=2.5 mm, Y=1 mm is 0.98. Further, when the pulse amplitude of the output of the amplifier 109 is delivered in voltage, for example, in the case of output value of 3 [V], the intensity of the reflected beam right after reflection from the multilayer substrate is 3/0.98 [V]=3.06 [V].

Consequently, this information is sent out into the operation processor 122 and is operated, and the output signal of the operation processor 122 is transmitted to the machining state detector 110. The machining state detector 110 divides the reflected beam intensity signal by the incident beam intensity signal, and generates a normalizing signal.

In the machining state judging unit 111, the reference value preset in the machining reference value setting unit 112 and the normalizing signal transmitted from he machining state detector are compared, and the pulse machining state is judged.

The machining reference value depends on the relation between the normalizing value and the drilled hole in the workpiece, that is, the exposed conductive layer area, and the normalizing value is larger when the conductive layer area is wider. Accordingly, the normalizing value corresponding to the desired hole is determined, and when exceeding this reference value, it is judged that the desired hole is exceeded. And when lower than the reference value, it is judged not reaching the desired hole. This judgement is transmitted to the controller 102.

The controller 102 finishes pulse machining when reaching the desired hole, if the number of laser machining processes has not reached the set value in the setting unit 101.

Thus, according to this embodiment, the machining state is uniform regardless of the machining position of the workpiece, and moreover by finishing the process when the workpiece has reached the desired machining state before the number of times of laser machining reaches the set number of laser outputs, holes of high quality are drilled at high yield, and the machining cycle time is shortened.

By contrast, if not reaching the desired hole, laser machining is continued. Laser machining and machining state judgement are repeated up to the number of output pulses set in the setting unit 101.

When the number of machining laser pulses has reached the number of output pulses set in the setting unit 101, the machining state at this point is judged.

In judgement of machining state by the machining state judging unit 111, if not reaching the desired machining state, the hole is processed as a machining error.

The error processing unit 113 discards the workpiece not reaching the desired machining state, and starts next pulse machining. Or, by storing the coordinates of the pulse drilled hole not reaching the desired pulse machining state, the position may be machined later, or discarded in a later process.

In this machining, the laser beam 106 outputted from the laser output unit 103 is detected by the laser beam detector 108, and the laser beam 106 is reflected by the workpiece, and this reflected laser beam 107 is detected by the laser beam detector 108, and an incident beam intensity signal and a reflected beam intensity signal are transmitted to the amplifier 109. The amplifier 109 amplifies these signals. The amplified signal of reflected beam is corrected as required depending on the machining position. Each signal is transmitted to the machining state detector 110. In the machining state detector 110, the reflected beam intensity signal is divided by the incident beam intensity signal, and a normalizing signal is generated. However, if the laser energy conditions necessary for machining of workpiece such as the laser output per 1 pulse, pulse width, and pulse interval to be set in the setting unit 101 are identical in each output pulse, it is not necessary to detect the incident laser beam 106 by the laser beam detector 108. In this case, only the reflected laser beam 107 is detected by the laser beam detector 108, and the reference value in this case is preset in the machining reference value setting unit 112, and the contrast with the data is judged in the machining state judging unit 111, and the result is transmitted to the controller 102.

By operating in such process, the insulating layer of the workpiece can be machined precisely as desired.

The laser machining method of the embodiment is described so far, and the laser output unit 103, optical system 104, and laser beam detector 108 for composing this embodiment are same as in embodiment 1 of the invention.

In this embodiment, same as in embodiment 1, the laser oscillator is a pulse laser oscillator, but depending on the workpiece, a laser oscillator may be used continuous wave type laser. In such a case, the laser energy condition, and the output time limiting level may be set beforehand.

In the embodiment, same as in embodiment 1, galvanometer mirrors are used as scanning mirrors, but similar effects are obtained by using polygonal mirrors, acousto-optic elements, electro-optic elements, hologram scanners or others.

In the embodiment, same as in embodiment 1, the focusing lens for machining 60 is the fθ lens, but similar effects are obtained by the optical system combining a plurality of single lenses or fresnel lenses.

Meanwhile, in this embodiment, in the reflected beam intensity calculator 121, the returning rate of reflected beam extracted from the reflected beam distribution table 120 is interpolated proportionally, but it is also realized by exponential function interpolation, polynomial interpolation, spline interpolation, or logarithmic interpolation.

In this embodiment, in the reflected light distribution table 120, the reflected light returning rate is stored in lattice in every equal pitch interval, but the value of returning rate may be stored by the returning rate width of reflected light, or the returning rate value of reflected light may be stored at rough pitches in the central area of the workpiece 105, and at dense pitches in the peripheral area.

Further, the reflected beam distribution table 120 may be applied by creating the reflected beam distribution table 120 corresponding to each action of the moving mechanism 130.

Embodiment 6

Embodiment 6 is similar to embodiment 2, and relates to a method of correcting the reflected beam at every machining position in embodiment 5. Hereinafter, embodiment 6 is described specifically while referring to the accompanying drawing.

Figure 15:
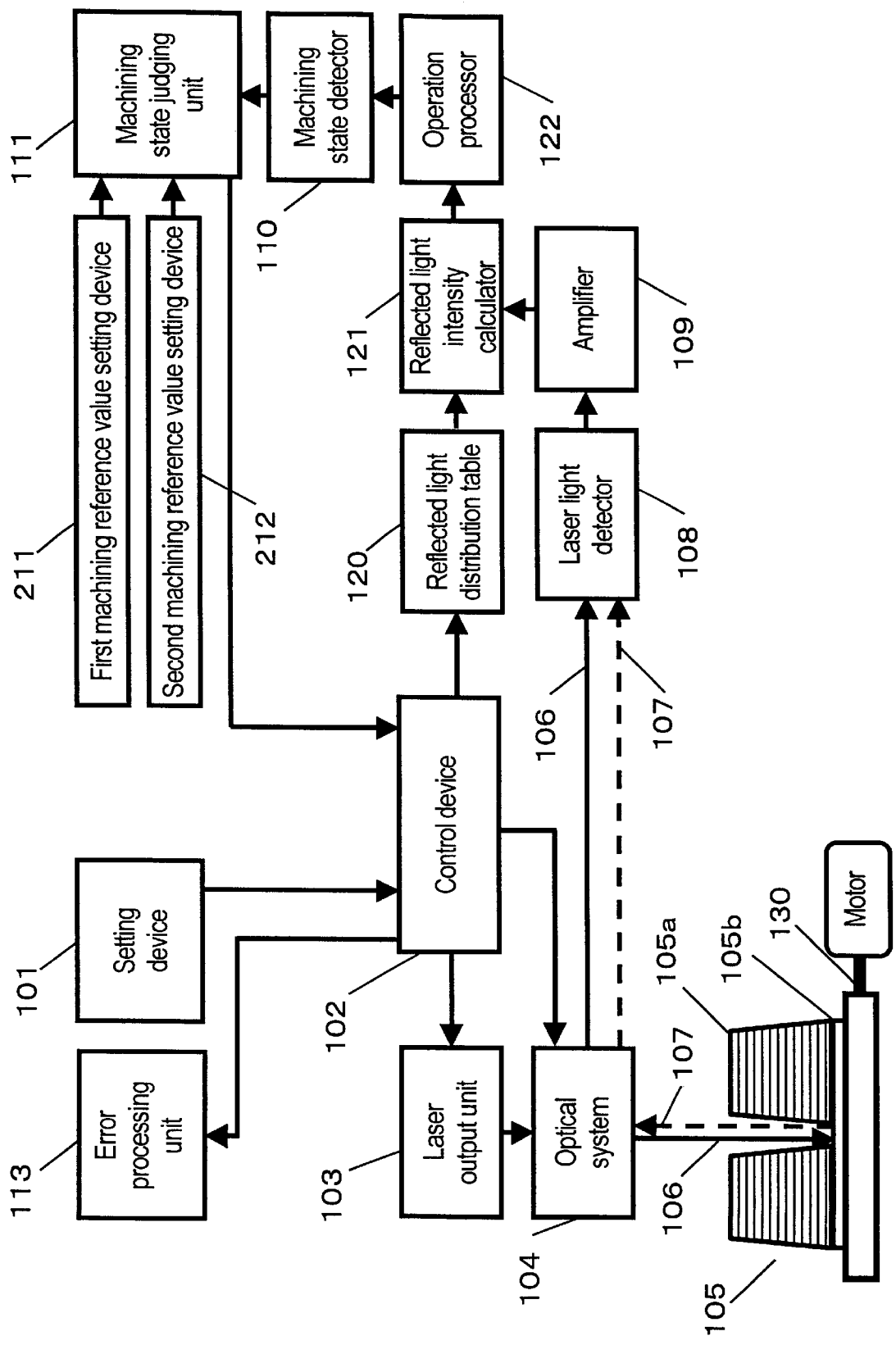
FIG. 15 is an outline drawing explaining a method of detecting machining state, a laser machining method, and a constitution of a laser machining apparatus in embodiment 6.

FIG. 15 showing the embodiment is the constitution adding the reflected beam distribution table 120, reflected beam intensity calculator 121, and operation processor 122 described in embodiment 5 to FIG. 9 showing embodiment 2.

In FIG. 15 showing the embodiment, elements 101 to 111, 113, 211 and 212 are same as explained in FIG. 9 relating to embodiment 2, and duplicate description is omitted. units 120, 121, 122 are same as explained in FIG. 14 relating to embodiment 5, and duplicate description is omitted.

The necessity of correction is same as explained in embodiment 5 of the invention. Herein, therefore, such description is omitted.

In FIG. 15, reference numeral 120 is the reflected beam distribution table storing the rate of reflected laser beam of the reflected laser beam 107 from the workpiece 105 returning to the laser beam detector 108, corresponding to the coordinates of the machining positions of the workpiece. Reference numeral 121 is the reflected beam intensity calculator for correcting the reflected beam from the data from the reflected beam distribution table 120 issued depending on the machining position information from the controller 102 and the output of the amplifier 109. Reference numeral 122 is an operation processor for operating by using the output signal from the reflected beam intensity calculator 121. The data of this operation processor 122 is sent to the machining state detector 110. This data is the corrected data.

The controller 102 has a function of counting the number of pulses of laser machining, and also has a function (not shown) of comparing with the number of output pulses set in the setting unit 101. The machining state judging unit 111 judges the pulse machining state by comparing preliminarily the reference value set in the first machining reference value setting unit 211 and the normalizing signal transmitted from the machining state detector 110. And also, the machining state judging unit 111 judges the pulse machining state by comparing preliminarily the reference value set in the second machining reference value setting unit 212 and the normalizing signal transmitted from the machining state detector 110. This judgement is sent to the controller 102 in every process of laser pulse machining. The result is judged when the number of laser machining processes has reached the number of output pulses set in the setting unit 101 (final pulse). That is, after output of the final laser pulse, the reference value set in the second machining reference value setting unit 212 and the normalizing signal transmitted from the machining state detector 110 are compared, and machining is finished when judged to have reached the second desired machining state. If not reaching the desired machining state, it is judged to be an error.

The relation of the first desired machining state and second desired machining state is same as mentioned in embodiment 2.

The error processing unit 113 discards the workpiece not reaching the desired machining state, and starts next pulse machining. Or, by storing the coordinates of the pulse drilled hole not reaching the desired pulse machining state, the position may be machined later, or discarded in a later process.

Thus, according to this embodiment, the machining state is uniform regardless of the machining position of the workpiece, and moreover by finishing the process when the workpiece has reached the desired machining state before the number of times of laser machining reaches the set number of laser outputs, holes of high quality are drilled at high yield, and the machining cycle time is shortened.

This machining is set in the setting unit 101, but if the laser energy conditions necessary for machining of workpiece such as the laser output per 1 pulse, pulse width, and pulse interval are identical in each output pulse, it is not necessary to detect the incident laser beam 106 by the laser detector 108. This point is same as explained in embodiment 1, and duplicate description is omitted.

The laser machining method of the embodiment is described so far, and the laser output unit 103, optical system 104, and laser beam detector 108 for composing the embodiment are same as in embodiment 1 of the invention.

In this embodiment, same as in embodiment 1, the laser oscillator is a pulse laser oscillator, but depending on the workpiece, a laser oscillator may be used continuous wave type laser. In such a case, the laser energy condition, and the output time limiting level may be set beforehand.

In this embodiment, same as in embodiment 1, galvanometer mirrors are used as scanning mirrors, but similar effects are obtained by using polygonal mirrors, acousto-optic elements, electro-optic elements, hologram scanners or others.

In the embodiment, same as in embodiment 1, the focusing lens for machining 60 is the fθ lens, but similar effects are obtained by the optical system combining a plurality of single lenses or fresnel lenses.

Meanwhile, in the embodiment, in the reflected beam intensity calculator 121, the returning rate of reflected beam extracted from the reflected beam distribution table 120 is interpolated proportionally, but it is also realized by exponential function interpolation, polynomial interpolation, spline interpolation, or logarithmic interpolation.

In the embodiment, in the reflected beam distribution table 120, the reflected beam returning rate is stored in lattice in every equal pitch interval, but the value of returning rate may be stored by the returning rate width of reflected beam, or the returning rate value of reflected beam may be stored at rough pitches in the central area of the workpiece 105, and at dense pitches in the peripheral area.

Further, the reflected beam distribution table 120 may be applied by creating the reflected beam distribution table 120 corresponding to each action of the moving mechanism 130.

Embodiment 7

Referring now to the drawing, embodiment 7 is described. This embodiment is similar to the machining state detecting method and machining method of embodiment 3, and relates to a machining state detecting method and machining method by executing a method of correcting the reflected beam at every machining position in embodiment 5.

Figure 16:
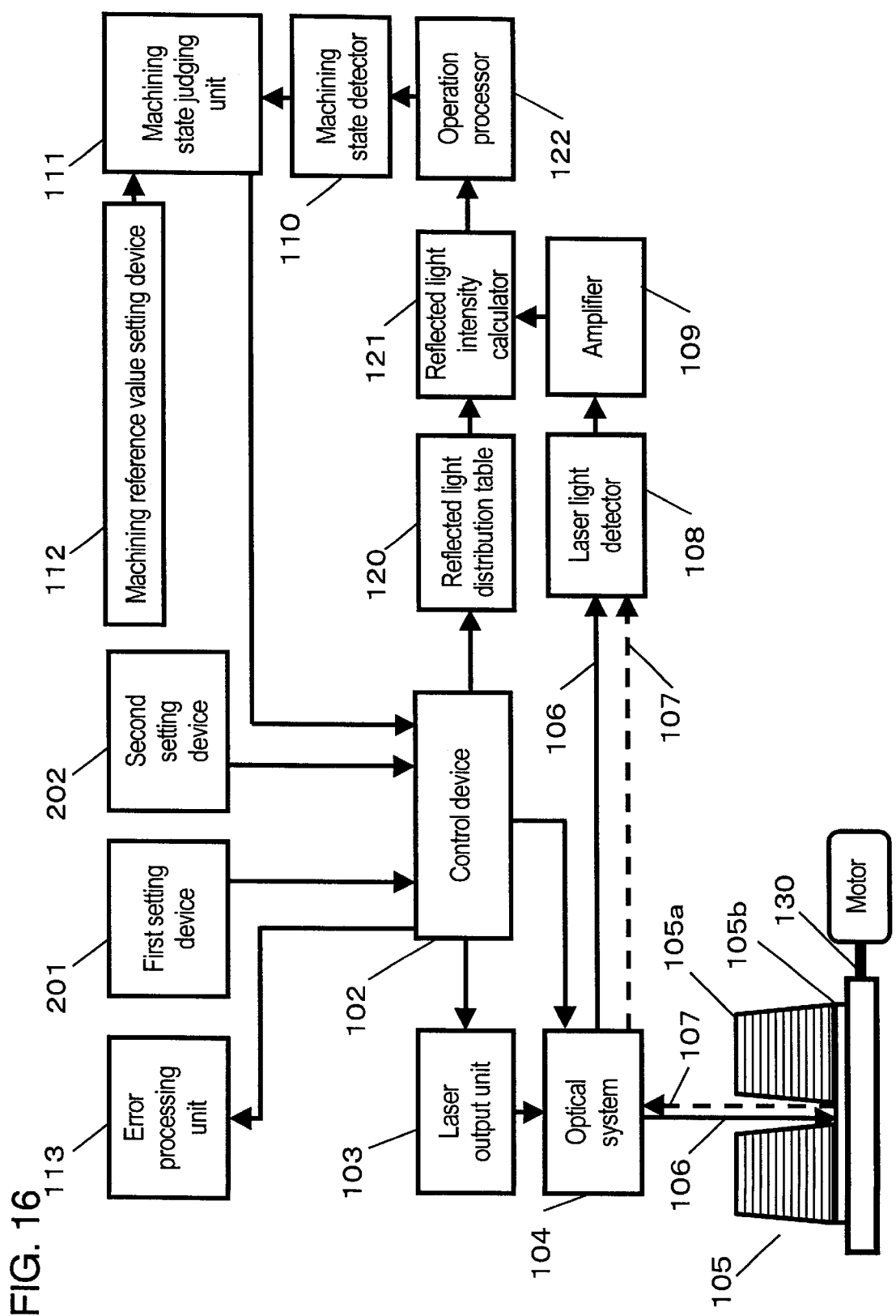
FIG. 16 is an outline drawing explaining a method of detecting machining state, a laser machining method, and a constitution of a laser machining apparatus in embodiment 7.

FIG. 16 showing this embodiment is the constitution adding the reflected beam distribution table 120, reflected beam intensity calculator 121, and operation processor 122 to FIG. 11 showing embodiment 3.

In FIG. 16 showing the embodiment, elements 102 to 113, 201 and 202 are same as explained in FIG. 11 relating to embodiment 3, and duplicate description is omitted. In FIG. 16, elements 120 to 122 are same as explained in FIG. 14 relating to embodiment 5, and duplicate description is omitted.

The necessity of correction in FIG. 16 is same as explained in embodiment 5 of this invention. Herein, therefore, such description is omitted. The operation of the correction data is same as in embodiment 5, and is not particularly explained herein.

The first setting unit 201 sets the laser energy condition necessary for machining of workpiece such as the laser output per 1 pulse, pulse width, and pulse interval, and the number of laser output pulses. The laser energy condition and the number of laser output pulses set herein are the conditions for machining the workpiece securely. Next, the second setting unit 202 sets the laser energy condition necessary for machining of workpiece such as the laser output per 1 pulse, pulse width, and pulse interval, and the number of laser output pulses. The laser energy condition and the number of laser outputs to be set herein are the condition for machining the workpiece such as circuit board, so that the workpiece begins to reach the desired machining state, that is, the exposed area of the conductor layer beneath the insulating layer begins to reach the desired area.

The controller 102 first controls the laser output unit 103 by the second setting unit 202. At this time, the operation of the machining state detector 110 and machining state judging unit 111 is stopped. From the final laser pulse output of the number of outputs set in the second setting unit 202, the machining state detector 110 and machining state judging unit 111 are put into operation. Hereinafter, the operation of laser machining up to the number of laser pulse outputs set in the first setting unit 201 is, including the method of correction, same as the detecting method of machining state and machining method of embodiment 5 of the invention.

Thus, according to this embodiment, the machining state is uniform regardless of the machining position of the workpiece, and moreover by finishing the process when the workpiece has reached the desired machining state before the number of times of laser machining reaches the set number of laser outputs, holes of high quality are drilled at high yield, and the machining cycle time is shortened.

This machining is set in the first setting unit 201, but if the laser energy conditions necessary for machining of workpiece such as the laser output per 1 pulse, pulse width, and pulse interval are identical in each output pulse, it is not necessary to detect the incident laser beam 106 by the laser beam detector 108. This point is same as explained in embodiment 1, and duplicate description is omitted.

By operating in such process, the insulating layer of the workpiece can be machined precisely as desired.

The laser machining method of this embodiment is described so far, and the laser output unit 103, optical system 104, and laser beam detector 108 for composing the embodiment are same as in embodiment 1 of the invention.

In this embodiment, same as in embodiment 1, the laser oscillator is a pulse laser oscillator, but depending on the workpiece, a laser oscillator may be used continuous wave type laser. In such a case, the laser energy condition, and the output time limiting level may be set beforehand.

In the embodiment, same as in embodiment 1, galvanometer mirrors are used as scanning mirrors, but similar effects are obtained by using polygonal mirrors, acousto-optic elements, electro-optic elements, hologram scanners or others.

In the embodiment, same as in embodiment 1, the focusing lens for machining 60 is the fθ lens, but similar effects are obtained by the optical system combining a plurality of single lenses or fresnel lenses.

Meanwhile, in the embodiment, in the reflected beam intensity calculator 121, the returning rate of reflected beam extracted from the reflected beam distribution table 120 is interpolated proportionally, but it is also realized by exponential function interpolation, polynomial interpolation, spline interpolation, or logarithmic interpolation.

In the embodiment, in the reflected beam distribution table 120, the reflected beam returning rate is stored in lattice in every equal pitch interval, but the value of returning rate may be stored by the returning rate width of reflected beam, or the returning rate value of reflected beam may be stored at rough pitches in the central area of the workpiece 105, and at dense pitches in the peripheral area.

Further, the reflected beam distribution table 120 may be applied by creating the reflected beam distribution table 120 corresponding to each action of the moving mechanism 130.

Embodiment 8

Referring now to the drawing, embodiment 8 is described. This embodiment is similar to the machining state detecting method and machining method of embodiment 4, and relates to a machining state detecting method and machining method by executing a method of correcting the reflected beam at every machining position in embodiment 5.

Figure 17:
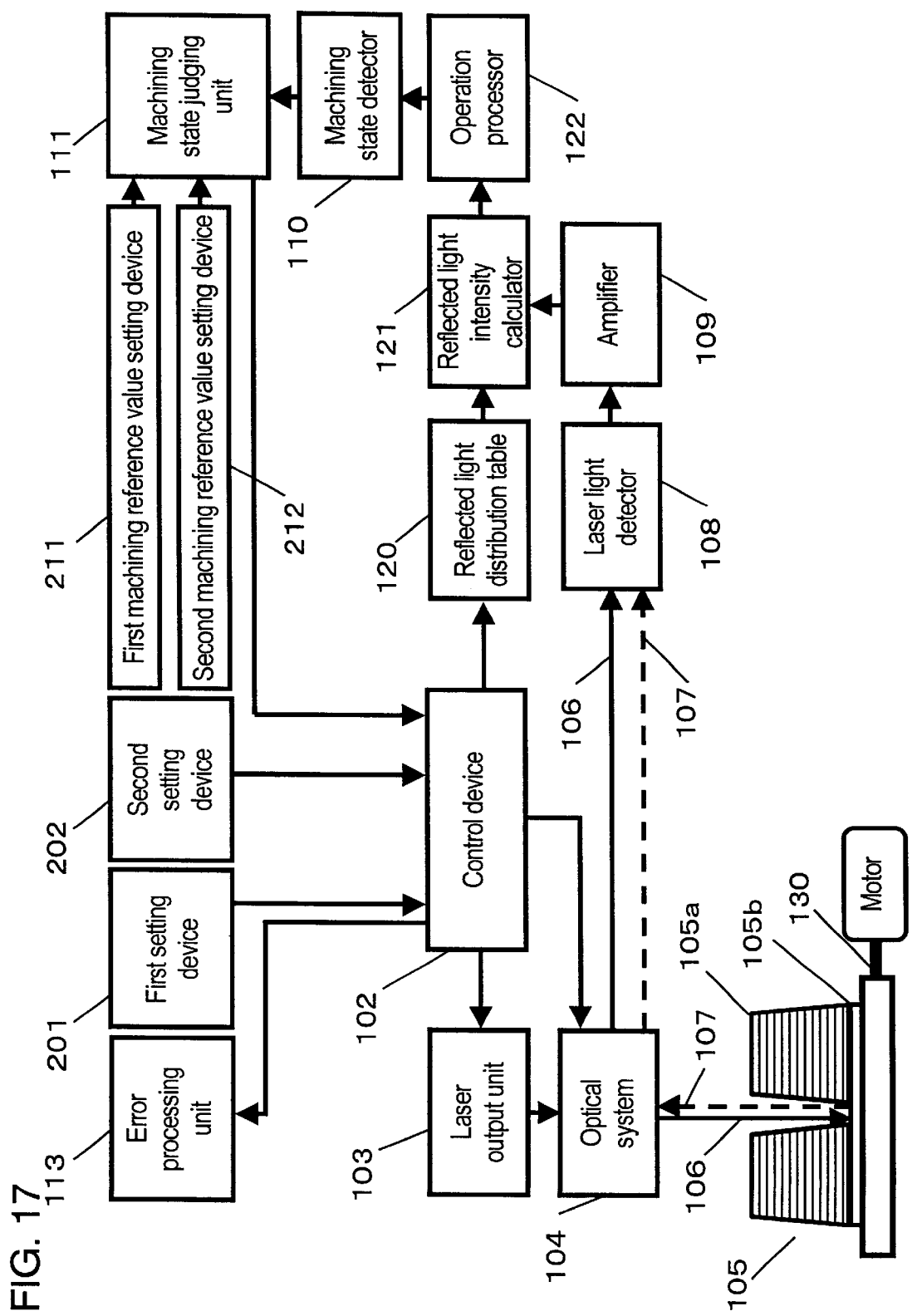
FIG. 17 is an outline drawing explaining a method of detecting machining state, a laser machining method, and a constitution of a laser machining apparatus in embodiment 8.

FIG. 17 showing the embodiment is the constitution adding the reflected beam distribution table 120, reflected beam intensity calculator 121, and operation processor 122 to FIG. 13 showing embodiment 4.

In FIG. 17 showing this embodiment, units 102 to 111, 113, 201, 202, 211 and 212 are same as explained in FIG. 13 relating to embodiment 4, and duplicate description is omitted. In FIG. 17, elements 120 to 122 are same as explained in FIG. 14 relating to embodiment 5, and duplicate description is omitted.

The necessity of correction in FIG. 17 is same as explained in embodiment 5 of the invention. Herein, therefore, such description is omitted. The operation of the correction data is same as in embodiment 5, and is not particularly explained herein.

Reference numeral 211 is a first machining reference value setting unit, and 212 is a second machining reference value setting unit.

The controller 102 first controls the laser output unit 103 by the second setting unit 202. At this time, the operation of the machining state detector 110 and machining state judging unit 111 is stopped. From the final laser pulse output of the number of outputs set in the second setting unit 202, the machining state detector 110 and machining state judging unit 111 are put into operation.

Hereinafter, the operation of laser machining up to the number of laser pulse outputs set in the first setting unit 201 is same as the detecting method of machining state of embodiment 4 of this invention.

The controller 102 has a function of counting the number of pulses of laser machining, and also has a function (not shown) of comparing with the number of output pulses set in the first setting unit 201. The machining state judging unit 111 judges the pulse machining state by comparing preliminarily the reference value set in the first machining reference value setting unit 211 and the normalizing signal transmitted from the machining state detector 110. And also, the machining state judging unit 111 judges the pulse machining state by comparing preliminarily the reference value set in the second machining reference value setting unit 212 and the normalizing signal transmitted from the machining state detector 110. This judgement is sent to the controller 102 in every process of laser pulse machining. The result is judged when the number of laser machining processes has reached the number of output pulses set in the first setting unit 201. That is, the reference value set in the second machining reference value setting unit 212 and the normalizing signal transmitted from the machining state detector 110 are compared, and machining is finished when judged to have reached the desired machining state. If not reaching the desired machining state, it is judged to be an error.

The error processing unit 113 discards the workpiece not reaching the desired machining state, and starts next pulse machining. Or, by storing the coordinates of the pulse drilled hole not reaching the desired pulse machining state, the position may be machined later, or discarded in a later process.

Thus, according to this embodiment, the machining state is uniform regardless of the machining position of the workpiece, and moreover by finishing the process when the workpiece has reached the desired machining state before the number of times of laser machining reaches the set number of laser outputs, holes of high quality are drilled at high yield, and the machining cycle time is shortened.

This machining is set in the first setting unit 201, but if the laser energy conditions necessary for machining of workpiece such as the laser output per 1 pulse of output pulse, pulse width, and pulse interval are identical in each output pulse, it is not necessary to detect the incident laser beam 106 by the laser beam detector 108. This point is same as explained in embodiment 1, and duplicate description is omitted.

The laser machining method of this embodiment is described so far, and the laser output unit 103, optical system 104, and laser beam detector 108 for composing the embodiment are same as in embodiment 1 of the invention.

In this embodiment, same as in embodiment 1, the laser oscillator is a pulse laser oscillator, but depending on the workpiece, a laser oscillator may be used continuous wave type laser. In such a case, the laser energy condition, and the output time limiting level may be set beforehand.

In the embodiment, same as in embodiment 1, galvanometer mirrors are used as scanning mirrors, but similar effects are obtained by using polygonal mirrors, acousto-optic elements, electro-optic elements, hologram scanners or others.

In the embodiment, same as in embodiment 1, the focusing lens for machining 60 is the f$\theta$ lens, but similar effects are obtained by the optical system combining a plurality of single lenses or fresnel lenses.

Meanwhile, in the embodiment, in the reflected beam intensity calculator 121, the returning rate of reflected beam extracted from the reflected beam distribution table 120 is interpolated proportionally, but it is also realized by exponential function interpolation, polynomial interpolation, spline interpolation, or logarithmic interpolation.

In this embodiment, in the reflected beam distribution table 120, the reflected beam returning rate is stored in lattice in every equal pitch interval, but the value of returning rate may be stored by the returning rate width of reflected beam, or the returning rate value of reflected beam may be stored at rough pitches in the central area of the workpiece 105, and at dense pitches in the peripheral area.

Further, the reflected beam distribution table 120 may be applied by creating the reflected beam distribution table 120 corresponding to each action of the moving mechanism 130.

Embodiment 9

In this embodiment, the basic function of detecting the reflected laser beam and controlling the machining is same as in embodiments 1 to 8, but as compared with embodiments 1 to 8, the function of detecting the reflected laser beam intensity is further reinforced.

In the foregoing embodiments 1 to 8, the signal relating to the beam intensity of the reflected laser beam 107 is detected, compared with the reference value, and machining is controlled according to the obtained result.

Figure 18A:
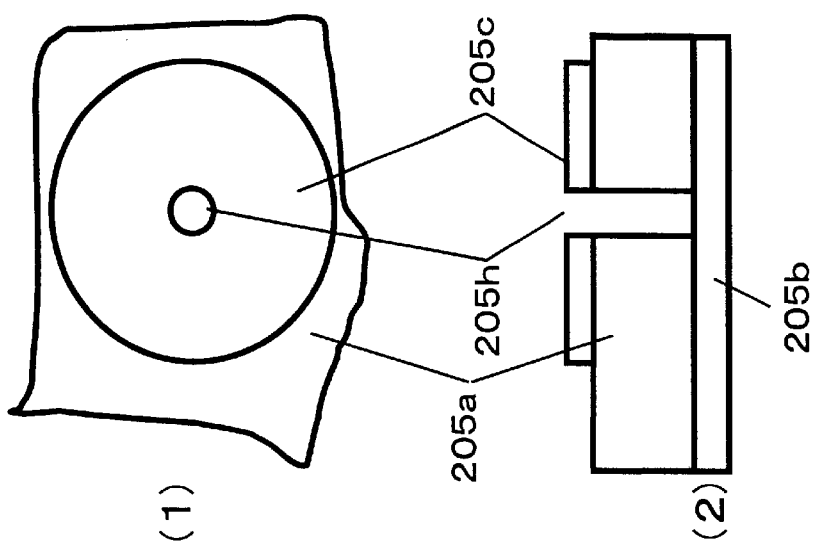
FIG. 18A is a schematic diagram showing a mode in which a drilled hole in the workpiece has not reached the conductive layer in embodiment 10.
Figure 18B:
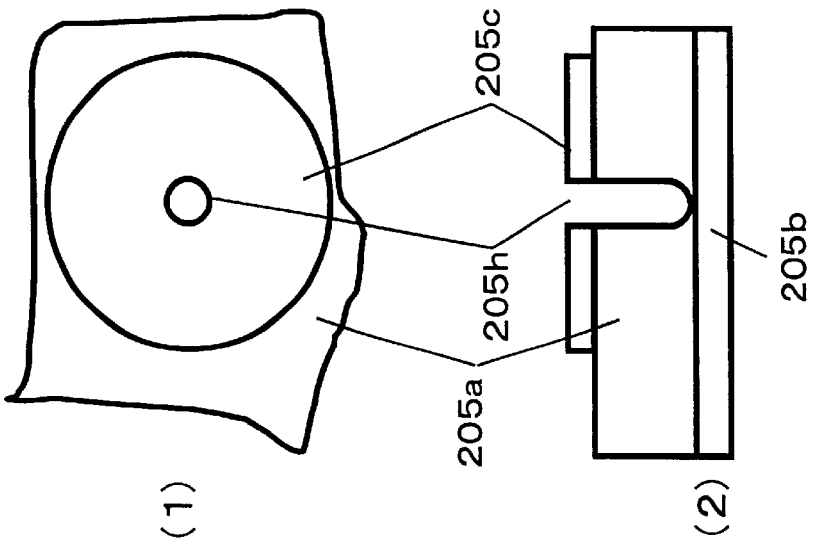
FIG. 18B is a schematic diagram showing a mode in which part of drilled hole in the workpiece has reached the conductive layer in embodiment 10.
Figure 18C:
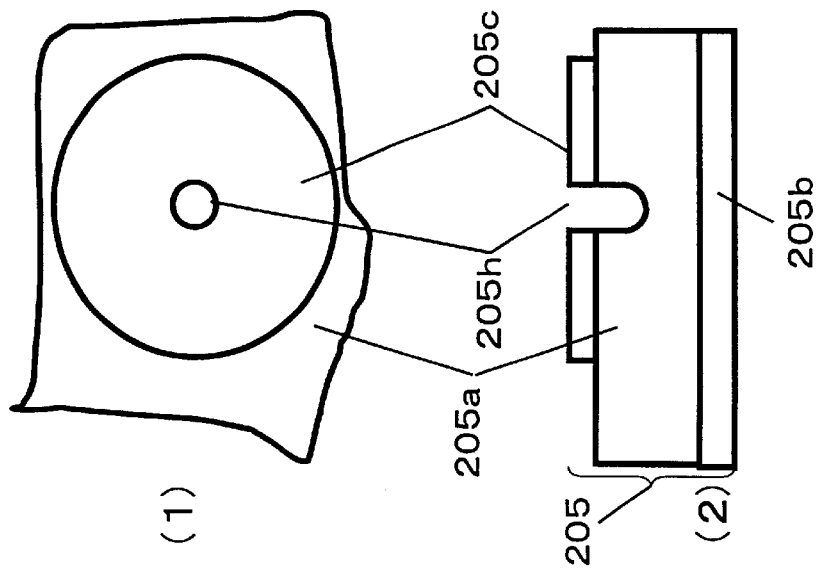
FIG. 18C is a schematic diagram showing a mode in which a majority of drilled hole in the workpiece has reached the conductive layer in embodiment 10.

FIG. 18A, FIG. 18B and FIG. 18C show examples of workpiece in this embodiment, and in each diagram, (1) is the top view and (2) is the sectional view. A workpiece 205 is composed of an insulating layer 205a, a first conductive layer 205b, and a second conductive layer 205c. The second conductive layer 205c has an opening part 205h, and its surface is directed to the laser light 106 for laser machining. In this state, by irradiation with laser beam, a hole 205h is drilled in the insulating layer 205a corresponding to the opening part 205h of the second conductive layer 205c.

The formula for determining the relative reflected beam intensity from the incident beam intensity and reflected beam intensity of the n-th pulse laser beam irradiation is, supposing:

k: an arbitrary constant
$a_n$: n-th incident laser beam intensity
$b_n$: n-th reflected laser beam intensity
$a_{max}$: maximum value of information about incident laser beam intensity
$b_{max}$: maximum value of information about reflected laser beam intensity and hence $c_n: k \times (b_n/a_n)$ $c_{max}: k \times (b_{max}/a_{max})$ expressed in Relative reflected beam intensity of n-th pulse=$(c_n - c_1)/(c_{max} - c_1)$     (Formula 1)

In formula 1, it is further described by giving specific numerical values.

First, for the sake of simplicity, the value of the constant k in formula 1 is determined in the value for satisfying the condition of $k \times b_{max} = a_{max}$.

As a result, $C_{max} = 1$ is obtained, and formula 1 is rewritten as in formula 3.

Relative reflected beam intensity of n-th pulse=$(c_n - c_1)/(1 - c_1)$     (Formula 3)

First, for example, the reflected beam from an arbitrary hole A is discussed.

When pulse laser beam is irradiated to the hole A continuously in time, suppose the information about the peak value of the first pulse laser beam is $c_1 = 0.1$, and that the information about the peak value of the N-th pulse laser beam is $c_n = 0.7$.

It means that the laser beam reflected by the second conductive layer 205c is 0.1, and that 0.9 is used for drilling the hole, and in the N-th pulse, it means that 0.6 obtained by subtracting 0.1 from 0.7 is the reflected beam from the inside of the hole.

At this time, the n-th relative reflected beam intensity is known to be 0.667 from formula 3.

Next, the reflected beam from an arbitrary hole B is discussed.

When pulse laser beam is irradiated to the hole B continuously in time, suppose the information about the peak value of the first pulse laser beam is $c_1 = 0.3$, and that the information about the peak value of the n-th pulse laser beam is $c_n = 0.7$.

It means that the laser beam reflected by the second conductive layer 205c is 0.3, and that 0.7 is used for drilling the hole, and in the n-th pulse, it means that 0.4 obtained by subtracting 0.3 from 0.7 is the reflected beam from the inside of the hole.

At this time, the n-th relative reflected beam intensity is known to be 0.571 from formula 3.

Since both holes have the same value of 0.7 as the information about the peak value of the n-th pulse laser beam, it may lead to a wrong conclusion of judging the approval or rejection of hole drilling simply from the n-th information.

Thus, by judging the ratio of quantity of beam returning as reflected beam out of the quantity of beam actually irradiated into the hole, approval or rejection of hole drilling may be judged adequately. And a hole for achieving conduction between adjacent conductive layers securely can be drilled reliably, and wasteful oscillation of output laser beam can be avoided, so that the through-put of machining may be enhanced.

In this embodiment, as the value of the information about the laser beam intensity used in the formula, the peak value of the pulse laser beam is assumed. But similar effects are obtained by using the laser beam intensity after lapse of a certain time from the moment of trigger of rise or fall of the laser beam oscillation or laser oscillation command signal.

To simplify the explanation, the constant k is determined as a value to satisfy the relation of $k \times b_{max} = a_{max}$, but any arbitrary integer may be used as the constant k.

As the method of obtaining $c_{max}$, prior to actual machining, preferably, it may be determined by using gold mirror or copper mirror instead of workpiece, but as required, it may be obtained by using the data acquired in actual machining.

In formula 1, c1 is the value obtained from the first incident laser beam intensity and first reflected beam intensity, but if the quantity of reflected beam from the bottom of the hole to be drilled is nearly zero, the first value may not be always used.

Furthermore, as far as fluctuation of the incident laser beam intensity in time and space is practically ignorable, $a_n$ may be supposed to be almost constant regardless of the value of n, and similar effects are obtained by using formula 4 instead of formula 1.

$$\text{Relative reflected beam intensity of n-th pulse} = (b_n - b_1)/(b_{max} - b_1) \quad \text{(Formula 4)}$$

where $b_n$: information about n-th reflected laser beam intensity $b_{max}$: maximum value of information about reflected laser beam intensity.

At this time, if it is preliminarily known that $a_n$ is almost constant regardless of the value of n, evidently, it is not necessary to use the incident beam detector (not shown) to be composed inside of the laser beam detector 108.

Embodiment 10

Referring now to the drawing, embodiment 10 of this invention is described in detail below.

Figure 19:
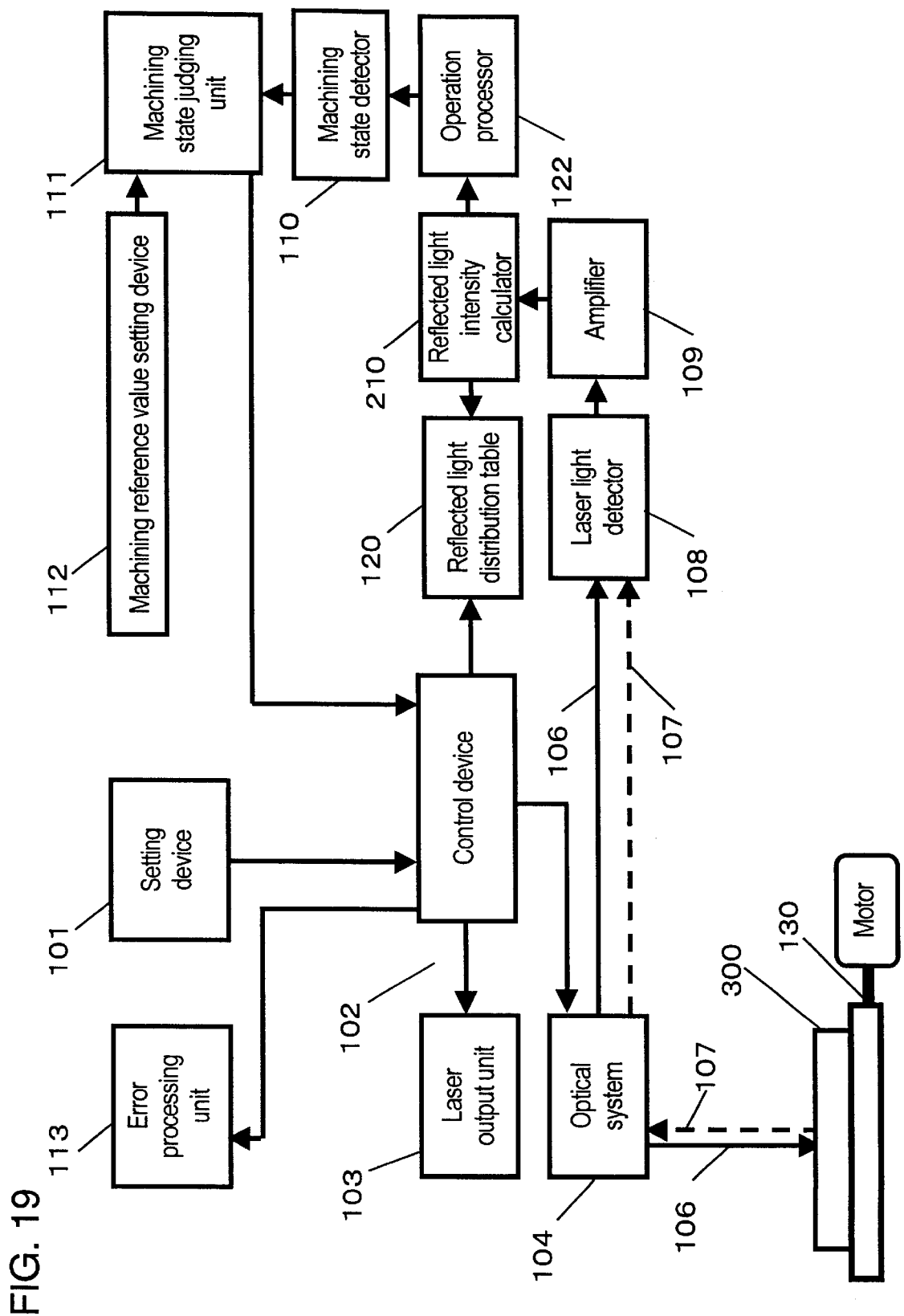
FIG. 19 is an outline drawing explaining preparation of reflected beam distribution table in embodiment 10.

FIG. 19 is an outline drawing showing a laser machining apparatus of this embodiment.

The constitution of the embodiment shown in FIG. 19 is similar to the constitution of embodiment 5 shown in FIG. 14, except that a table creation unit 210 is added, the reflected beam intensity calculator 121 is deleted, and the workpiece 105 is replaced by a fixed mirror 300.

In this constitution, the operation is specifically described below.

First, the laser beam 106 outputted from the laser output unit 103 reaches the fixed mirror 300, and the reflected laser beam 107 reaches the reflected beam detector (not shown) composed in the laser beam detector 108, and the reflected laser beam 107 is amplified in the amplifier 109, and so far the operation is same as in embodiment 5.

From the position information of the control unit 102 and the incident beam intensity output of the amplifier 109, the ratio of the reflected beam intensity output of the amplifier 109 is calculated. This calculation is applied to the entire machining region of the workpiece. The laser light is emitted to the position necessary for creating the reflected light distribution table 120, and the intensity of the reflected light from the mixed mirror 300 is detected. Then, the following calculation is executed in each laser emitting position.

$$\text{Reflected beam returning rate} = (\text{reflected beam/incident beam})/\text{MAX (reflected beam/incident beam)}$$

This calculation result is stored in the reflected beam distribution table 120 as the reflected beam returning rate corresponding to each laser irradiating position. FIGS. 20 is a practical example of reflected beam distribution table.

The returning rate of the reflected beam to each position of the machining region is stored as the table. As a result, the reflected beam distribution table used in the embodiment 5 can be created.

This creation of reflected beam distribution table is executed similarly in embodiments 6 to 8.

The data to be stored in the reflected beam distribution table may be divided equally in the machining region of the data to be stored, or divided roughly in the central part of the machining region and densely in the peripheral area of the machining region, so that the changing rate of the data to be stored may be constant.

In this embodiment, as the fixed mirror, actually, a gold mirror, a copper mirror, a multilayered dielectric film mirror or the like may be used.

Industrial Applicability

The invention provides a laser machining method comprising;

a step of executing laser machining after setting the number of laser outputs as the laser output condition for drilling holes in the workpiece by plural times of laser pulse outputs, a step of detecting the machining state of the workpiece in the process of execution of laser machining, and judging if reaching the desired machining state or not by laser machining, and a step of finishing the laser machining when judging the workpiece has reached the desired machining state, if not reaching the set number of laser outputs, and otherwise continuing the laser machining up to the set number of laser outputs.

And a laser machining apparatus having a machining section.

Therefore by finishing the process when the workpiece has reached the desired machining state before the number of times of laser machining reaches the set number of laser outputs, holes of high quality are drilled at high yield, and the machining cycle time is shortened.

According to the above constitution and method, this invention can estimate the intensity of the reflected beam from the multilayer substrate which is the workpiece, by correcting the signal pulse amplitude of the reflected beam issued from the amplifier depending on the machining position, so that the hole drilling state can be judged, and not only machining is done accurately and securely, but also wasteful oscillation of output laser beam may be avoided.

Similarly, by estimating the intensity of the reflected beam right after reflection from the multilayer circuit board which is the workpiece, from the detected reflected beam, and calculating the ratio of quantity of beam returning as reflected beam from the quantity of beam actually applied inside of the hole, the hole drilling state can be judged, and not only machining is done accurately and securely, but also wasteful oscillation of output laser beam may be avoided.

By irradiating the laser to the mirror at each machining position, detecting the laser irradiated to the mirror and the laser beam of the reflected beam, obtaining the returning rate of the reflected beam, and storing it in the table for utilizing, the intensity of the reflected beam right after reflection from the object of laser irradiation can be accurately estimated.

What is claimed is:

1. A laser machining method comprising the steps of:

generating a plurality of energy pulses with a laser;

applying said plurality of energy pulses to a workpiece;

detecting a machining state of the workpiece using reflected energy resulting from applying said energy pulses to said workpiece; and terminating said applying of said energy pulses to said workpiece based on a result of said detecting.

2. A laser machining method comprising the steps of:
generating a plurality of energy pulses with a laser;
applying said plurality of energy pulses to a workpiece;
detecting a machining state of the workpiece using reflected energy resulting from applying said energy pulses to said workpiece
terminating said applying of said energy pulses to said workpiece based on a result of said detecting and performing error processing.

3. A laser machining method comprising:
generating a plurality of energy pulses with a laser;
applying said plurality of energy pulses to a workpiece;
detecting a first machining state of the workpiece using reflected energy resulting from applying said energy pulses to said workpiece; and
terminating said applying of said energy pulses to said workpiece based on a result of said detecting; and
detecting a second machining state of the workpiece.

4. A laser machining method comprising:
generating a plurality of energy pulses with a laser;
applying said plurality of energy pulses to a workpiece;
detecting a first machining state of the workpiece using reflected energy resulting from applying said energy pulses to said workpiece;
terminating said applying of said energy pulses to said workpiece based on a result of said detecting;
detecting a second machining state of the workpiece and performing error processing.

5. A laser machining method comprising the steps of:
setting a first laser output condition for generating a first plurality of energy pulses with a laser;
setting a second laser output condition for generating a second plurality of energy pulses with a laser;
applying said second plurality of energy pulses to a workpiece
detecting a machining state of the workpiece and using reflected energy resulting from said applying of said second plurality of energy pules;
terminating said applying of said second plurality of energy pulses based on a result of said detecting and said first laser output condition.

6. A laser machining method comprising the steps of:
setting a first laser output condition for generating a first plurality of energy pulses with a laser;
setting a second laser output condition for generating a second plurality of energy pulses with a laser;
applying said second plurality of energy pulses to a workpiece
detecting a machining state of the workpiece and using reflected energy resulting from said applying of said second plurality of energy pules;
terminating said applying of said second plurality of energy pulses based on a result of said detecting and said first laser output condition; and
performing error processing at said first output condition.

7. A laser machining method comprising:
setting a first laser output condition for generating a first plurality of energy pulses with a laser;
setting a second laser output condition for generating a second plurality of energy pulses with a laser;
applying said second plurality of energy pulses to a workpiece
detecting a machining state of the workpiece and using reflected energy resulting from said applying of said second plurality of energy pules;
terminating said applying of said second plurality of energy pulses based on a result of said detecting and said first laser output condition;
detecting a second machining state based on said first output.

8. A laser machining method comprising:
setting a first laser output condition for generating a first plurality of energy pulses with a laser;
setting a second laser output condition for generating a second plurality of energy pulses with a laser;
applying said second plurality of energy pulses to a workpiece
detecting a machining state of the workpiece and using reflected energy resulting from said applying of said second plurality of energy pules;
terminating said applying of said second plurality of energy pulses based on a result of said detecting and said first laser output condition; and
performing error processing based on said second output condition.

9. A laser machining method of claim 1, wherein the ration of the laser output intensity and the reflected beam intensity from the workpiece is used at the step of detecting the machining state of the workpiece and judging if reaching the desired machining state or not by laser machining.

10. A laser machining method of claim 2, wherein the ration of the laser output intensity and the reflected beam intensity from the workpiece is used at the step of detecting the machining state of the workpiece and judging if reaching the desired machining state or not by laser machining.

11. A laser machining method of claim 3, wherein the ration of the laser output intensity and the reflected beam intensity from the workpiece is used at the step of detecting the machining state of the workpiece and judging if reaching the desired machining state or not by laser machining.

12. A laser machining method of claim 4, wherein the ration of the laser output intensity and the reflected beam intensity from the workpiece is used at the step of detecting the machining state of the workpiece and judging if reaching the desired machining state or not by laser machining.

13. A laser machining method of claim 5, wherein the ration of the laser output intensity and the reflected beam intensity from the workpiece is used at the step of detecting the machining state of the workpiece and judging if reaching the desired machining state or not by laser machining.

14. A laser machining method of claim 6, wherein the ration of the laser output intensity and the reflected beam intensity from the workpiece is used at the step of detecting the machining state of the workpiece and judging if reaching the desired machining state or not by laser machining.

15. A laser machining method of claim 7, wherein the ration of the laser output intensity and the reflected beam intensity from the workpiece is used at the step of detecting the machining state of the workpiece and judging if reaching the desired machining state or not by laser machining.

16. A laser machining method of claim 8, wherein the ration of the laser output intensity and the reflected beam intensity from the workpiece is used at the step of detecting the machining state of the workpiece and judging if reaching the desired machining state or not by laser machining.

* * * * *

UNITED STATES PATENT AND TRADEMARK OFFICE
CERTIFICATE OF CORRECTION

PATENT NO.   : 6,441,337 B1  
DATED        : August 27, 2002  
INVENTOR(S)  : K. Isaji et al.

It is certified that error appears in the above-identified patent and that said Letters Patent is hereby corrected as shown below:

Column 29,  
Line 43, delete "pules" and insert -- pulses --.

Column 30,  
Lines 5 and 20, delete "pules" and insert -- pulses --.

Signed and Sealed this

Fifteenth Day of April, 2003

JAMES E. ROGAN  
*Director of the United States Patent and Trademark Office*